(12) United States Patent
Amano et al.

(10) Patent No.: US 7,429,500 B2
(45) Date of Patent: Sep. 30, 2008

(54) METHOD OF MANUFACTURING A SEMICONDUCTOR DEVICE

(75) Inventors: Kenji Amano, Hokkaido (JP); Hajime Hasebe, Hokkaido (JP)

(73) Assignee: Renesas Technology Corp., Tokyo (JP)

( * ) Notice: Subject to any disclaimer, the term of this patent is extended or adjusted under 35 U.S.C. 154(b) by 35 days.

(21) Appl. No.: 11/409,014

(22) Filed: Apr. 24, 2006

(65) Prior Publication Data
US 2006/0240599 A1 Oct. 26, 2006

(30) Foreign Application Priority Data
Apr. 25, 2005 (JP) .............................. 2005-126392

(51) Int. Cl.
*H01L 21/00* (2006.01)
(52) U.S. Cl. ...................................... 438/112; 257/670
(58) Field of Classification Search ................. 438/112
See application file for complete search history.

(56) References Cited
U.S. PATENT DOCUMENTS 5,458,158 A * 10/1995 Kawanabe ................. 140/105
6,402,009 B1 * 6/2002 Ishikawa ..................... 228/6.2
6,611,048 B1 * 8/2003 Fazelpour et al. ........... 257/670
2004/0232442 A1 * 11/2004 Shimanuki .................. 257/199

* cited by examiner

*Primary Examiner*—Thao X. Le
*Assistant Examiner*—Kimberly Trice
(74) *Attorney, Agent, or Firm*—Mattingly, Stanger, Malur & Brundidge, PC.

(57) ABSTRACT

According to the method of manufacturing a semiconductor device, a lead frame is provided wherein the thickness of a tab-side end portion of a silver plating for wire connection formed on each suspending lead 1e is smaller than that of a silver plating formed on each lead. Thereafter, a semiconductor chip is mounted onto a tab. In this case, since the entire surface of the silver plating on the suspending lead 1e is in a crushed state, it is possible to prevent contact of the semiconductor chip with the silver plating when mounting the chip onto the tab. Consequently, in a die bonding process, the semiconductor chip can slide on the tab without contacting the silver plating and thereby making it possible to diminish damage to the semiconductor chip when mounted onto the tab and hence to possibly prevent cracking or chipping of the chip when assembling the semiconductor device.

10 Claims, 19 Drawing Sheets

US 7,429,500 B2

METHOD OF MANUFACTURING A SEMICONDUCTOR DEVICE

BACKGROUND OF THE INVENTION

The present invention relates to a semiconductor device manufacturing technique and particularly a technique applicable effectively to the manufacture of a semiconductor device having plated suspending leads.

A QFN (Quad Flat Non-leaded Package) type semiconductor device comprises a tab which supports a semiconductor chip, a sealing portion formed by sealing the semiconductor chip with resin, tab suspending leads for supporting the tab, and a plurality of leads exposed to peripheral edge portions of a back surface of the sealing portion, the tab being a small tab and sealed with the sealing resin (see, for example, Patent Literature 1).

[Patent Literature 1]
International Publication WO 01/003186 (FIG. 40)

SUMMARY OF THE INVENTION

In assembling such a semiconductor device as a QFN type semiconductor device there is used a lead frame having leads plated with silver for wire connection. The silver plating for the leads of the lead frame is performed through a mask. In this case, the mask alignment accuracy is deteriorated as the semiconductor device becomes smaller in size or narrower in pitch. As a result, the silver plating is applied also onto the suspending leads connected to the tab in the lead frame.

Having made a study about assembling a semiconductor device using a lead frame with silver plating applied onto suspension leads, the present inventors found out the following problem.

There is known a QFN structure wherein a tab is incorporated within a sealing body. Means for installing the tab within the sealing body is known wherein suspending leads are bent to form bent portions to raise the tab so that the height of the tab becomes higher than each of the leads, thereby allowing the sealing resin to spread also on the back side and burying the tab within the sealing body.

More particularly, in a lead frame manufacturing stage, as in a comparative example shown in FIG. 25, an offset work is applied to each suspending lead 1e of a lead frame 1 with use of an offset die 9 to form a bent portion 1j.

However, as noted above, the mask alignment accuracy at the time of silver-plating the leads of the lead frame is becoming lower with reduction in size and pitch of the semiconductor device, and a silver plating film 8 is formed also on each suspending lead. There sometimes is a case where a tab-side end or a vicinity thereof of the silver plating film 8 thus formed lies at a position not covered with the offset die.

If the offset work is performed in this state, a part (tab-side end portion) of the silver plating film 8 may remain in a projected state without being crushed, as shown in the portion "After Offset Work" of FIG. 25.

As shown in a comparative example of FIG. 26, the silver plating film 8 which remains uncrushed comes into contact with an end portion of a semiconductor chip 2 in a die bonding process during assembly of the semiconductor device, thus giving rise to the problem that a crack 12 is developed in the semiconductor chip 2 as shown in a comparative example of FIG. 27.

More particularly, as shown in the comparative example of FIG. 26, a play is formed on a chucking surface 10a of a collet 10 which is adapted to move while chucking the semiconductor chip 2 in the die bonding process, so that in many cases the semiconductor chip 2 is not held horizontally with respect to a tab 1b. Or, the semiconductor chip 2 is disposed obliquely in the course of a die bonding material 6 on the tab 1b being crushed by the semiconductor chip.

Therefore, during die bonding, an end portion of the semiconductor chip 2 strikes against the silver plating 8 and the semiconductor chip 2 cannot slide on the suspending leads 1e, with the result that the crack 12 is formed in the chip or there occurs chipping of the chip.

Consequently, the reliability of the semiconductor device is deteriorated, for example, it is impossible to ensure required electrical characteristics of the semiconductor device. This poses a problem.

In Patent Literature 1 (International Publication WO 01/003186) referred to above, none of silver plating for wire connection formed on suspending leads, offset work for the suspending leads, and the positional relation between the silver plating and the offset die, are described. Even if a silver plating film is formed on the suspending leads in the above patent literature, no disclosure is found therein about means for crushing the whole of the silver plating so as not to allow a projecting portion to remain by offset work.

It is an object of the present invention to provide a technique able to prevent cracking and chipping in a die bonding process for a semiconductor device.

It is another object of the present invention to provide a technique able to improve the reliability of a semiconductor device.

The above and other objects and novel features of the present invention will become apparent from the following description and the accompanying drawings.

The following is an outline of typical modes of the present invention as disclosed herein.

In one aspect of the present invention there is provided a semiconductor device manufacturing method comprising providing a lead frame, the lead frame having a tab, leads and suspending leads, the thickness of a metal plating film formed on each of the suspending leads being smaller than the thickness of a metal plating film formed on each of the leads, and thereafter mounting a semiconductor chip onto the tab.

In another aspect of the present invention there is provided a semiconductor device manufacturing method comprising providing a lead frame, the lead frame having a tab, leads and suspending leads, the thickness of a tab-side end portion of a metal plating film formed on each of the suspending leads being smaller than the thickness of a metal plating film formed on each of the leads and smaller than the thickness of an opposite-side end portion, and thereafter mounting a semiconductor chip onto the tab.

In a further aspect of the present invention there is provided a semiconductor device manufacturing method comprising providing a lead frame, the lead frame having a tab, leads and suspending leads, a first main surface connected to a chip mounting surface of the tab in each of the suspending leads and the chip mounting surface of the tab being formed level with each other and a tab-side end portion of a metal plating film formed on each of the suspending leads being disposed within a recess formed in the first main surface, and thereafter mounting a semiconductor chip onto the tab.

The following is a brief description of effects obtained by the typical modes of the present invention.

Since there is provided a lead frame wherein the thickness of a tab-side end portion of a metal plating for wire connection formed on each suspending lead is smaller than the thickness of a metal plating for wire connection formed on each lead, and thereafter a semiconductor chip is mounted onto a tab, the metal plating on each suspending lead is crushed and therefore it is possible to prevent contact of the semiconductor chip with metal plating in die bonding. As a result, the semiconductor chip can slide on the tab without contact with metal plating in die bonding, whereby the damage to the semiconductor chip in die bonding is diminished and therefore it is possible to prevent cracking or chipping in the semiconductor device.

DETAILED DESCRIPTION OF PREFERRED EMBODIMENTS

Figure 1:
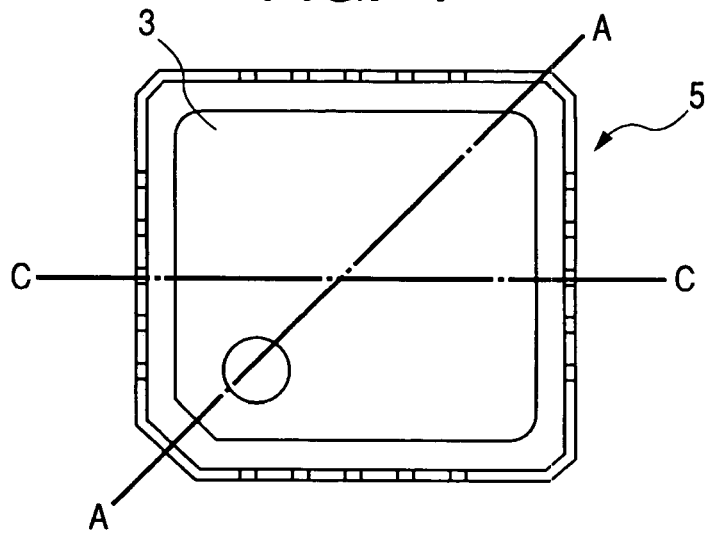
FIG. 1 is a plan view showing an example of the structure of a semiconductor device according to a first embodiment of the present invention.

In the following embodiments, as to the same or similar portions, repeated explanations thereof will be omitted in principle except where required.

Where required for convenience sake, the following embodiments will each be described in a divided manner into plural sections or embodiments, but unless otherwise mentioned, they are not unrelated to each other but are in a relation such that one is a modification or a detailed or supplementary explanation of part or the whole of the other.

In the following embodiments, when reference is made to the number of elements (including the number, numerical value, quantity and range), no limitation is made to the number referred to, but numerals above and below the number referred to will do as well unless otherwise mentioned and except the case where it is basically evident that limitation is made to the number referred to.

Embodiments of the present invention will be described in detail hereinunder with reference to the accompanying drawings. In all of the drawings for illustrating the embodiments, members having the same functions are identified by the same reference numerals, and repeated explanations thereof will be omitted.

First Embodiment

Figure 2:
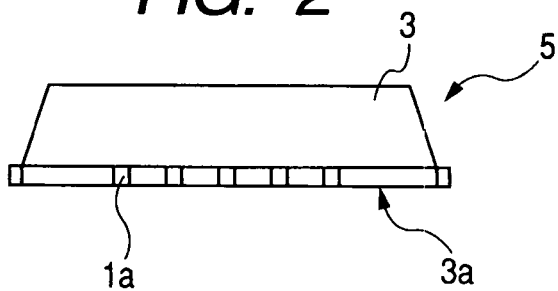
FIG. 2 is a side view thereof.
Figure 3:
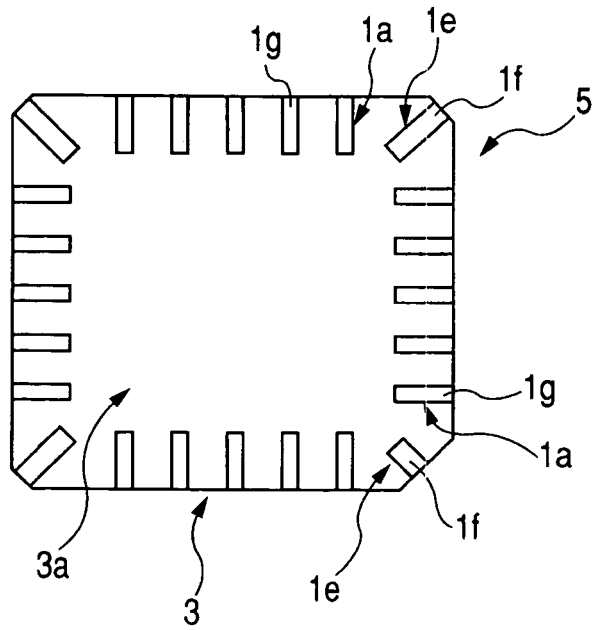
FIG. 3 is a back view thereof.
Figure 4:
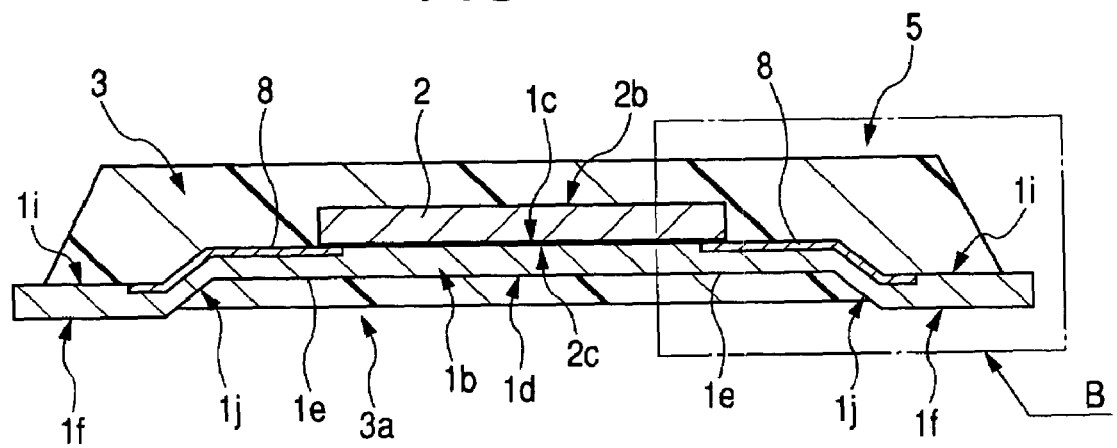
FIG. 4 is a sectional view showing the structure of a section taken along line A-A in FIG. 1.
Figure 5:
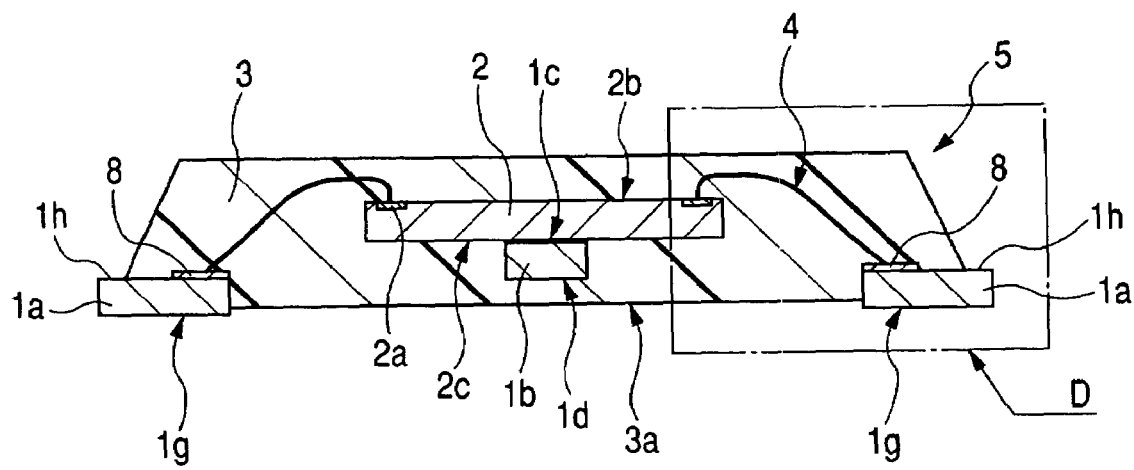
FIG. 5 is a sectional view showing the structure of a section taken along line C-C in FIG. 1.
Figure 6:
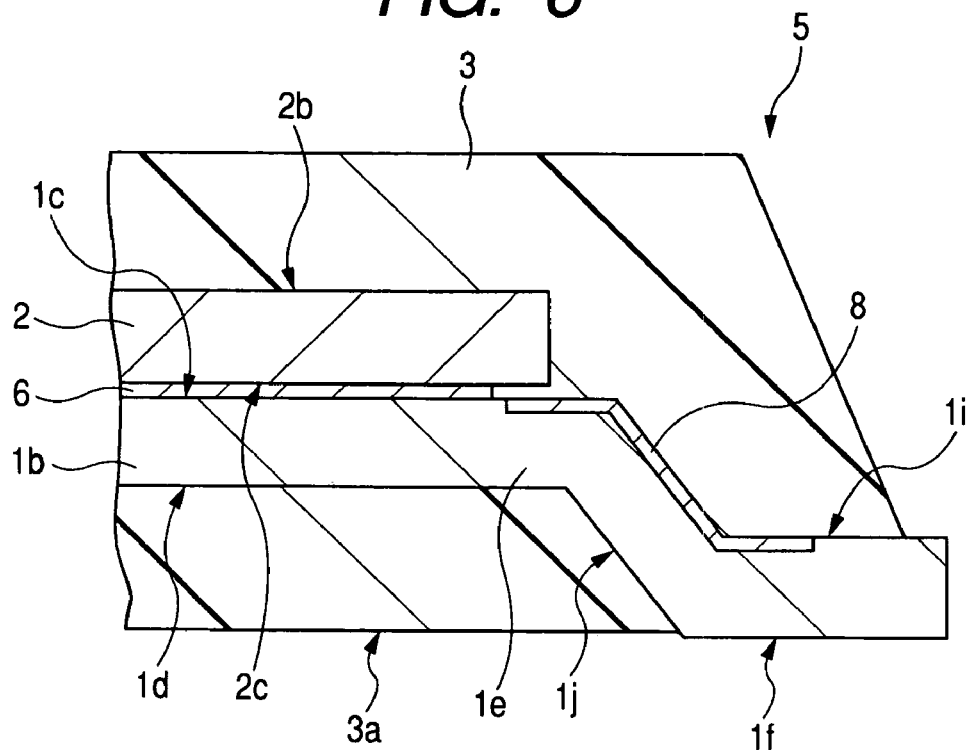
FIG. 6 is a partial enlarged sectional view showing on a larger scale an example of the structure of portion B in FIG. 4.
Figure 7:
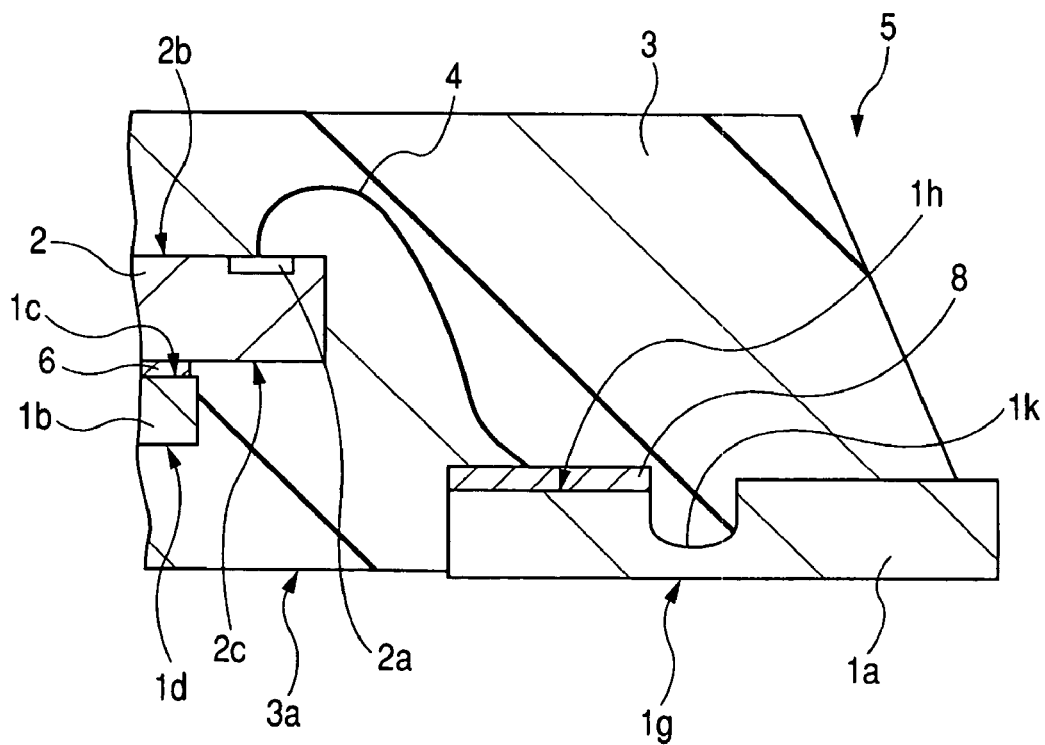
FIG. 7 is a partial enlarged sectional view showing on a larger scale an example of the structure of portion D in FIG. 5.
Figure 8:
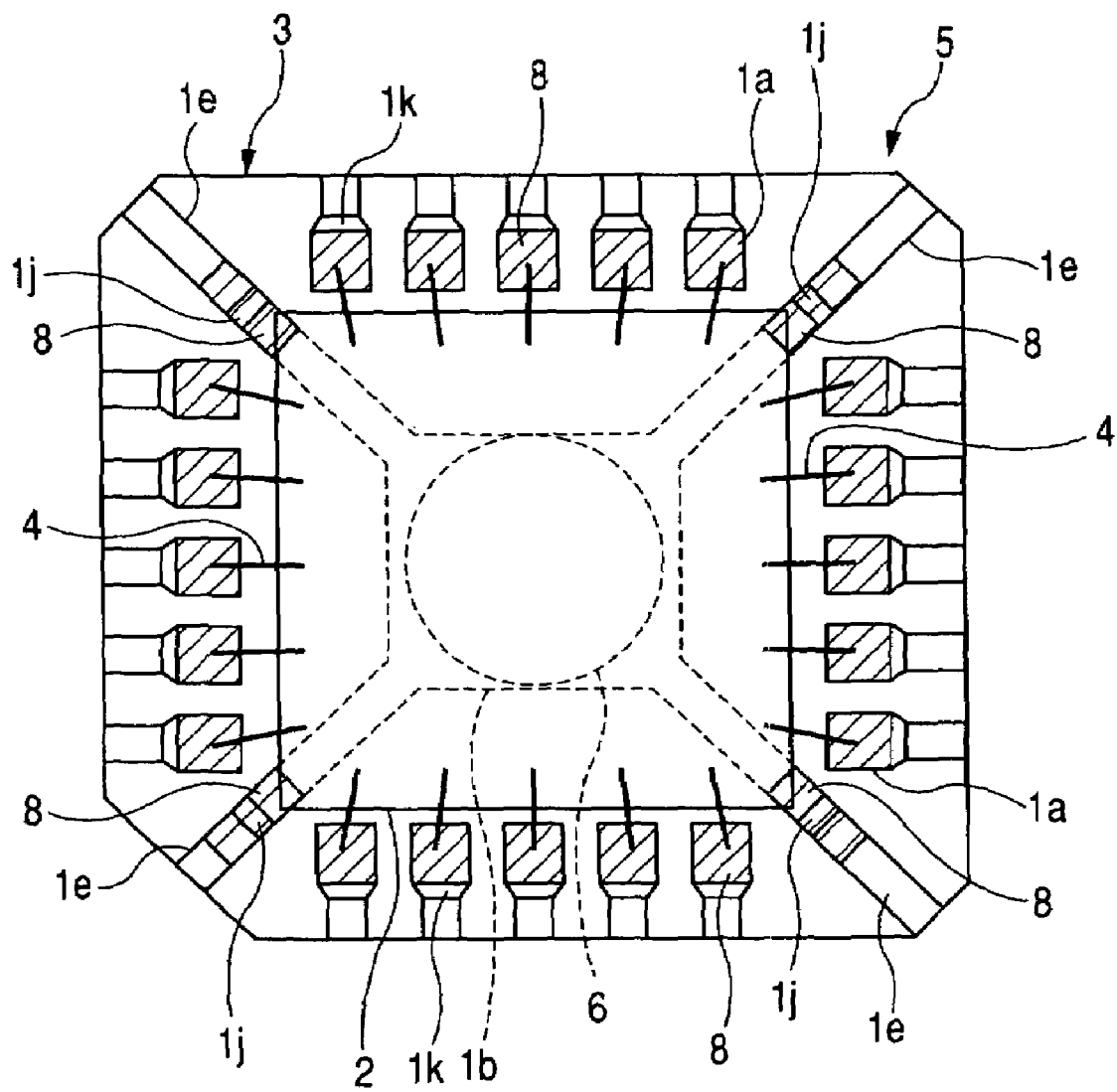
FIG. 8 is a plan view showing an example of an internal structure of the semiconductor device of FIG. 1 as seen through a sealing body.
Figure 9:
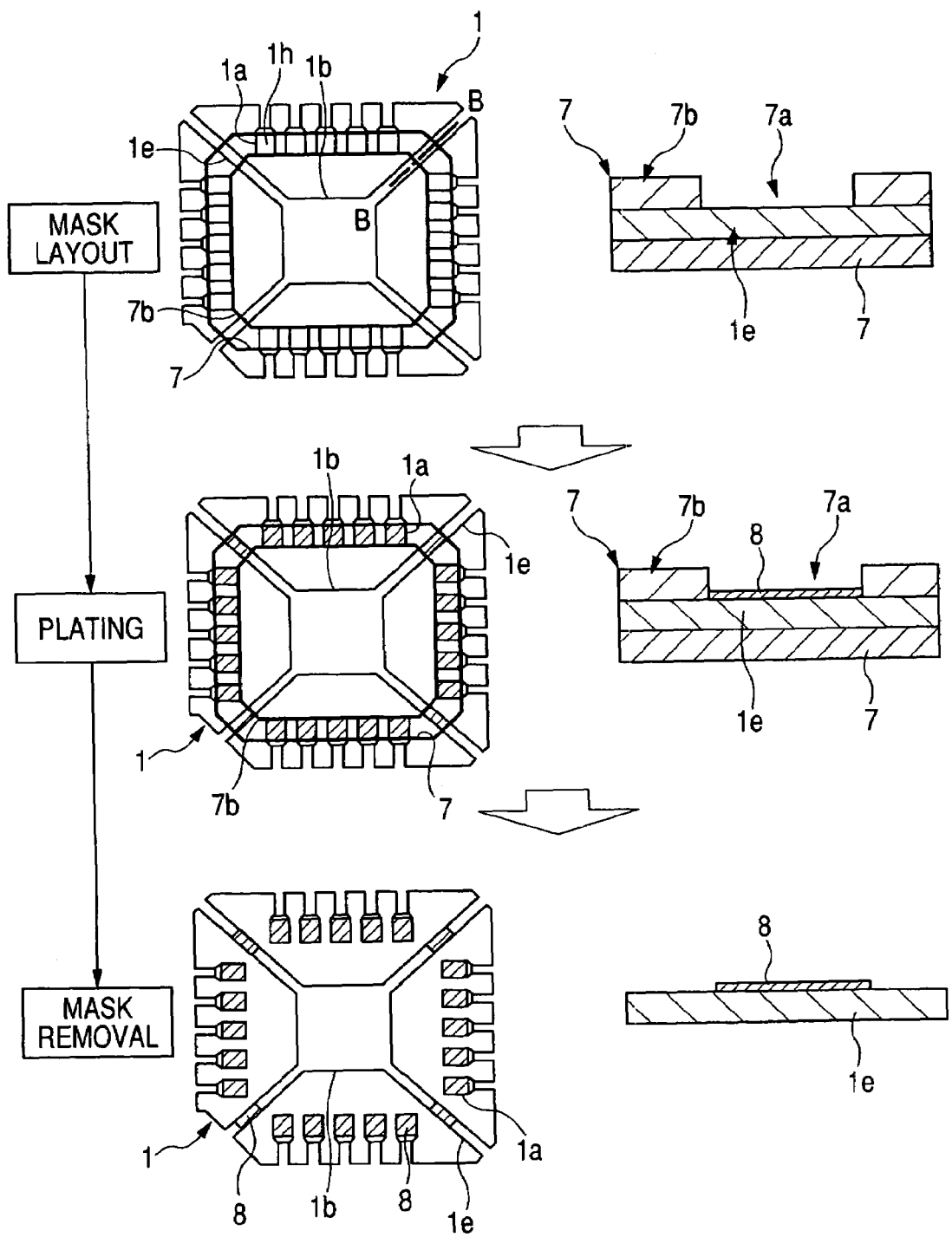
FIG. 9 comprises plan views and sectional views, showing an example of a method for forming a metal plating onto a lead frame used in assembling the semiconductor device of FIG. 1.
Figure 10:
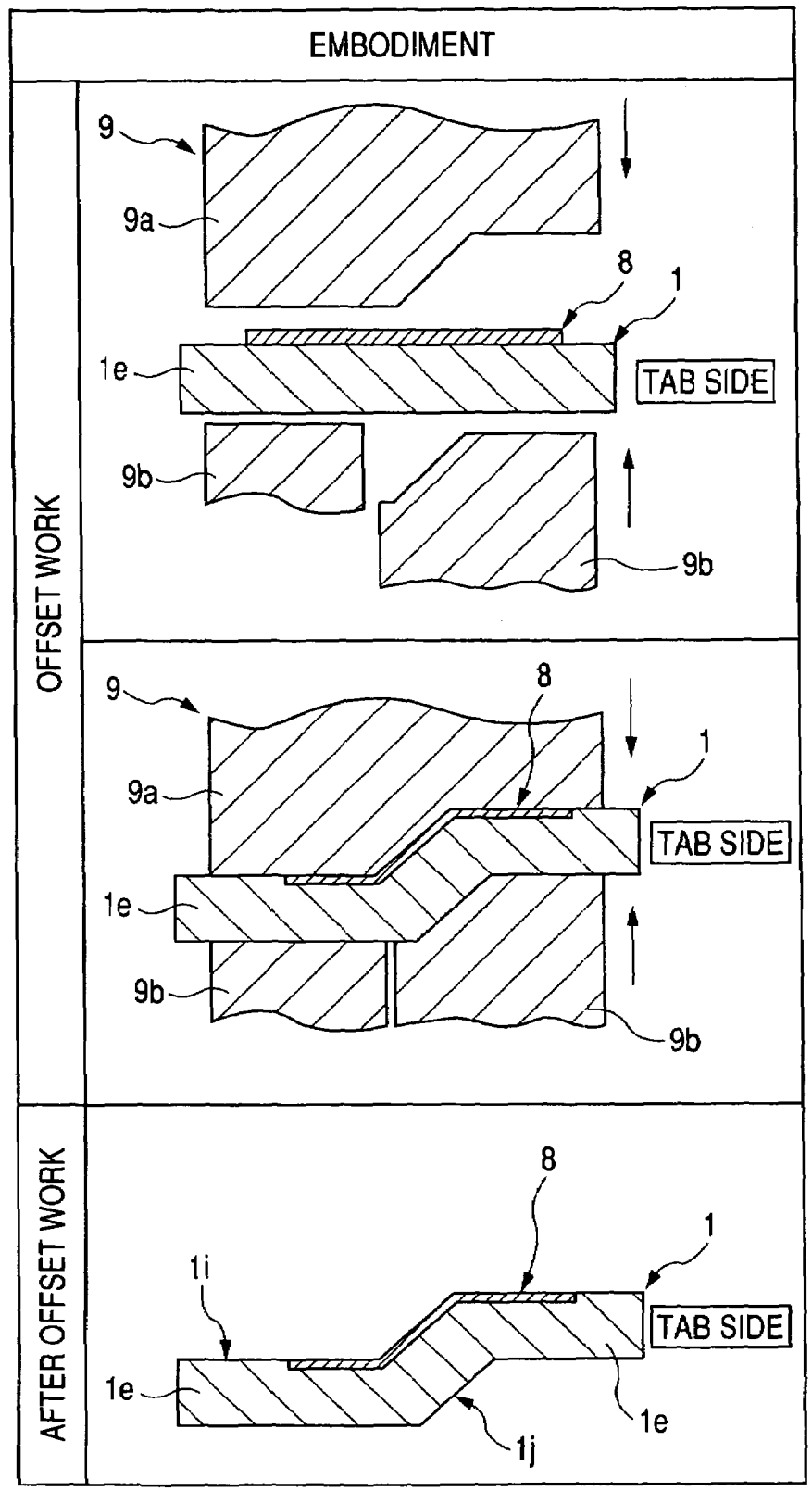
FIG. 10 is a partial sectional view showing an example of an offset work method for each suspending lead of the lead frame shown in FIG. 9.

FIG. 1 is a plan view showing an example of the structure of a semiconductor device according to a first embodiment of the present invention, FIG. 2 is a side view thereof, FIG. 3 is a back view thereof, FIG. 4 is a sectional view showing the structure of a section cut along line A-A in FIG. 1, and FIG. 5 is a sectional view showing the structure of a section cut along line C-C in FIG. 1. FIG. 6 is a partial enlarged sectional view showing on a larger scale a structural example of portion B in FIG. 4, FIG. 7 is a partial enlarged sectional view showing on a larger scale a structural example of portion D in FIG. 5, and FIG. 8 is a plan view showing an example of an internal structure of the semiconductor device of FIG. 1 as seen through a sealing body. FIG. 9 comprises plan views and sectional views, showing an example of a method for forming a metal plating onto a lead frame used in assembling the semiconductor device of FIG. 1, FIG. 10 is a partial sectional view showing an example of an offset work method for each suspending leads of the lead frame shown FIG. 9, and FIG. 11 comprises a plan view and sectional views, showing a structural example after the offset work for each suspending lead of the lead frame shown in FIG. 10.

Figure 12:
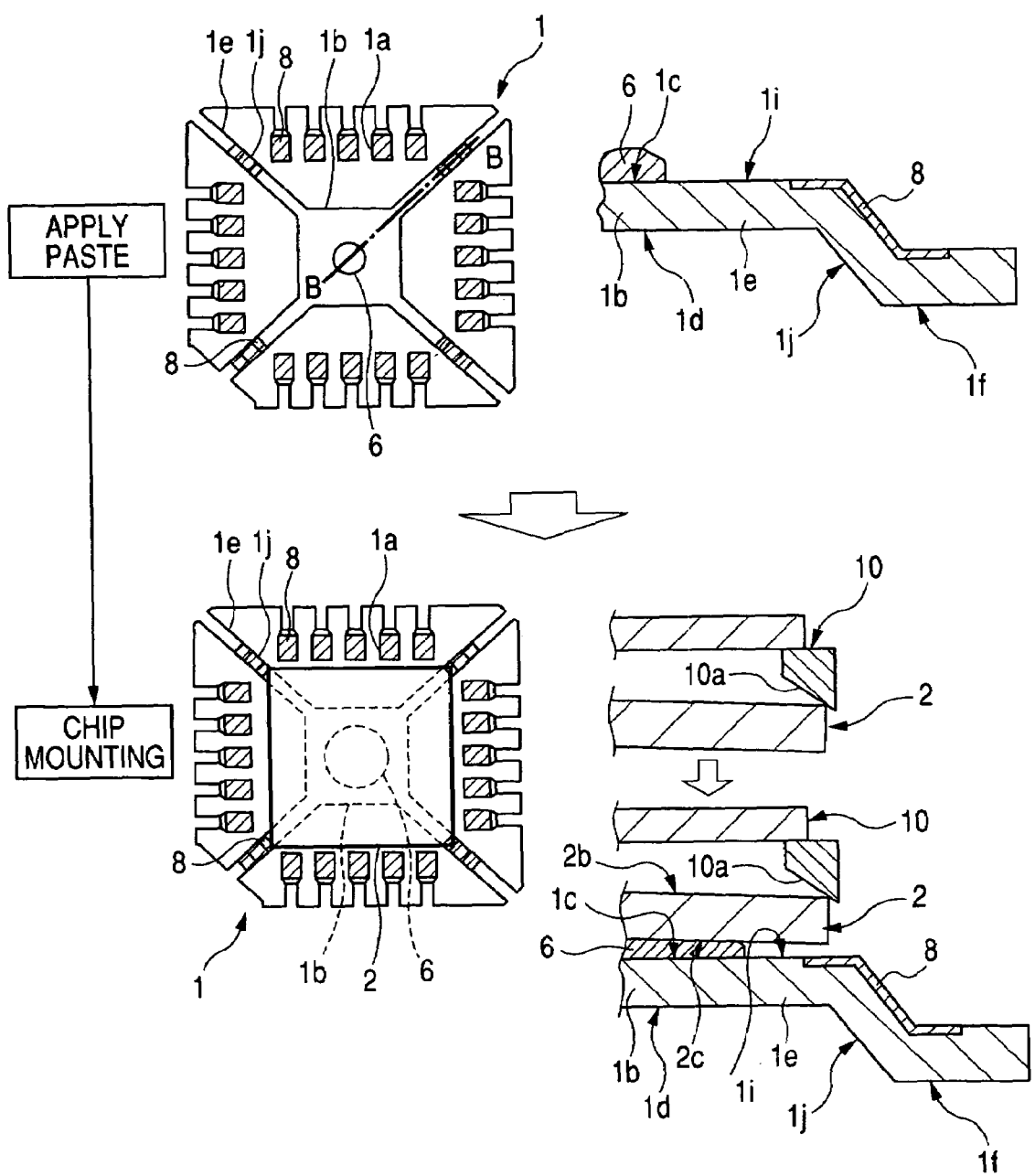
FIG. 12 comprises plan views and partial sectional views, showing an example of a die bonding procedure in assembling the semiconductor device shown in FIG. 1.
Figure 13:
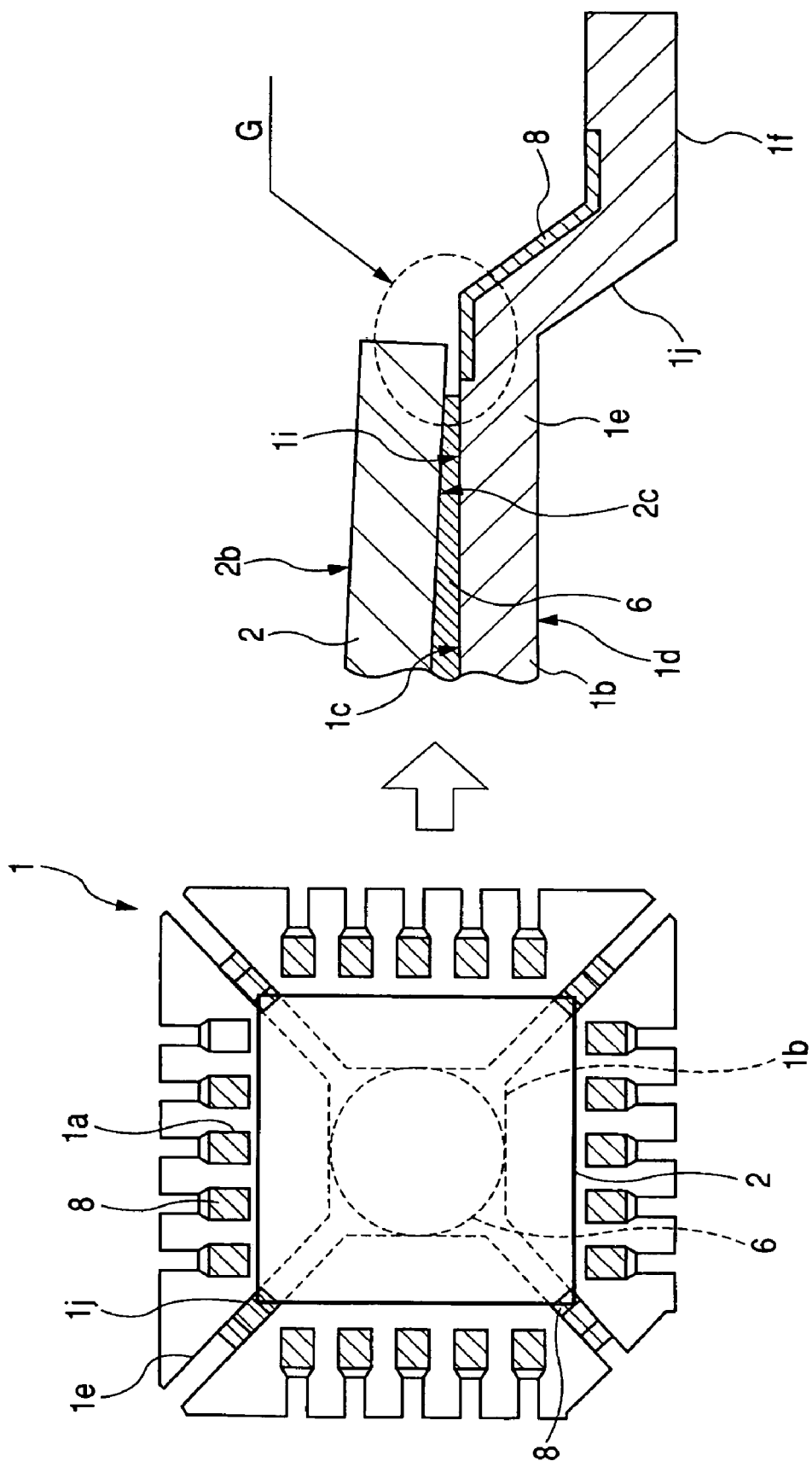
FIG. 13 comprises a plan view and a partial sectional view, showing a structural example after the end of the die bonding shown in FIG. 12.
Figure 14:
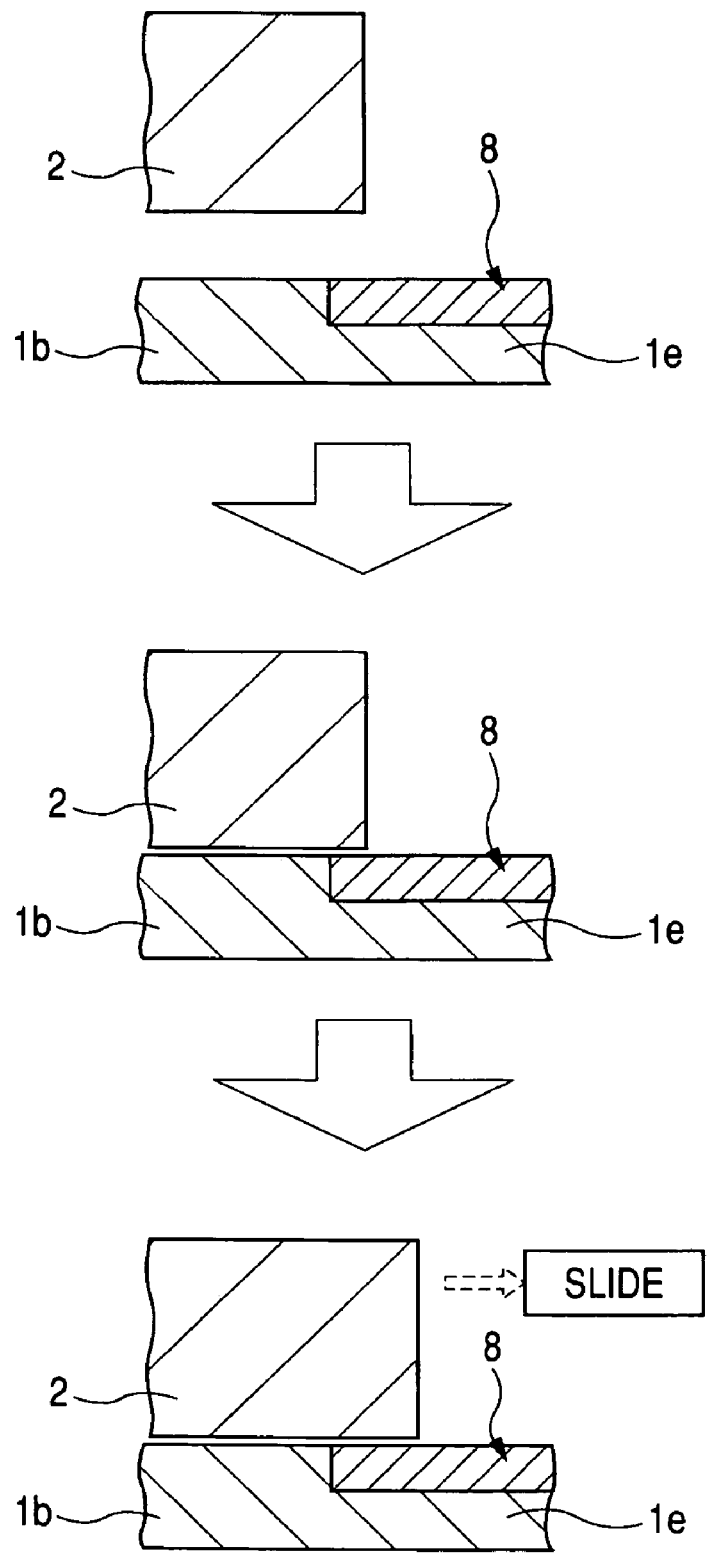
FIG. 14 is a partial sectional view showing an example of a sliding state of a semiconductor chip in portion G shown in FIG. 13.
Figure 15:
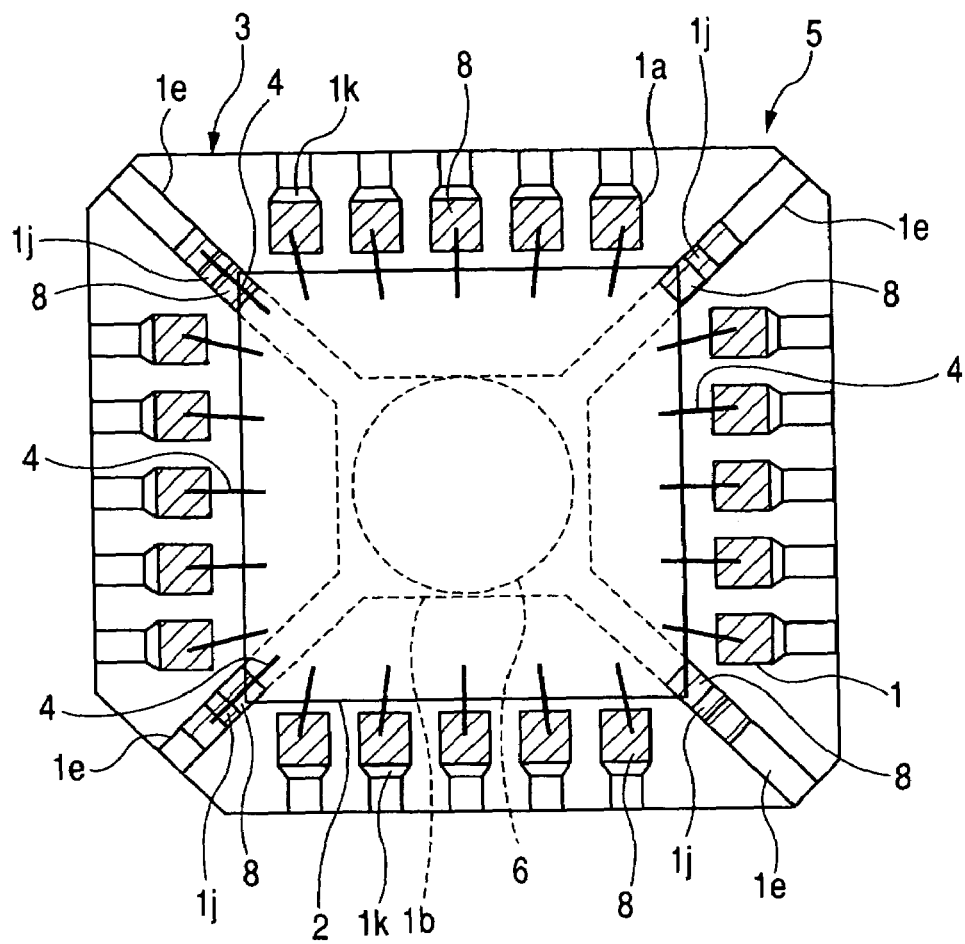
FIG. 15 is a plan view showing an internal structure of a semiconductor device according to a modification of the first embodiment as seen through a sealing body.
Figure 16:
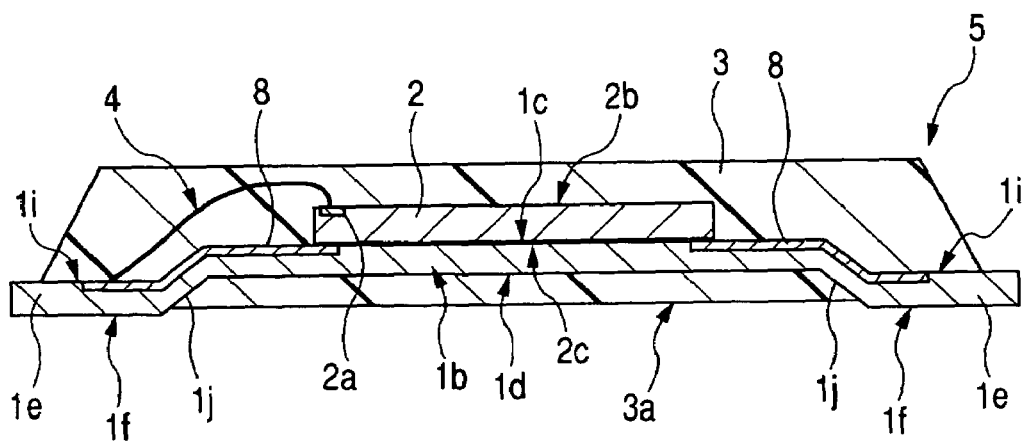
FIG. 16 is a sectional view showing a cut structure along suspending leads in the semiconductor device of the modification shown in FIG. 15.
Figure 17:
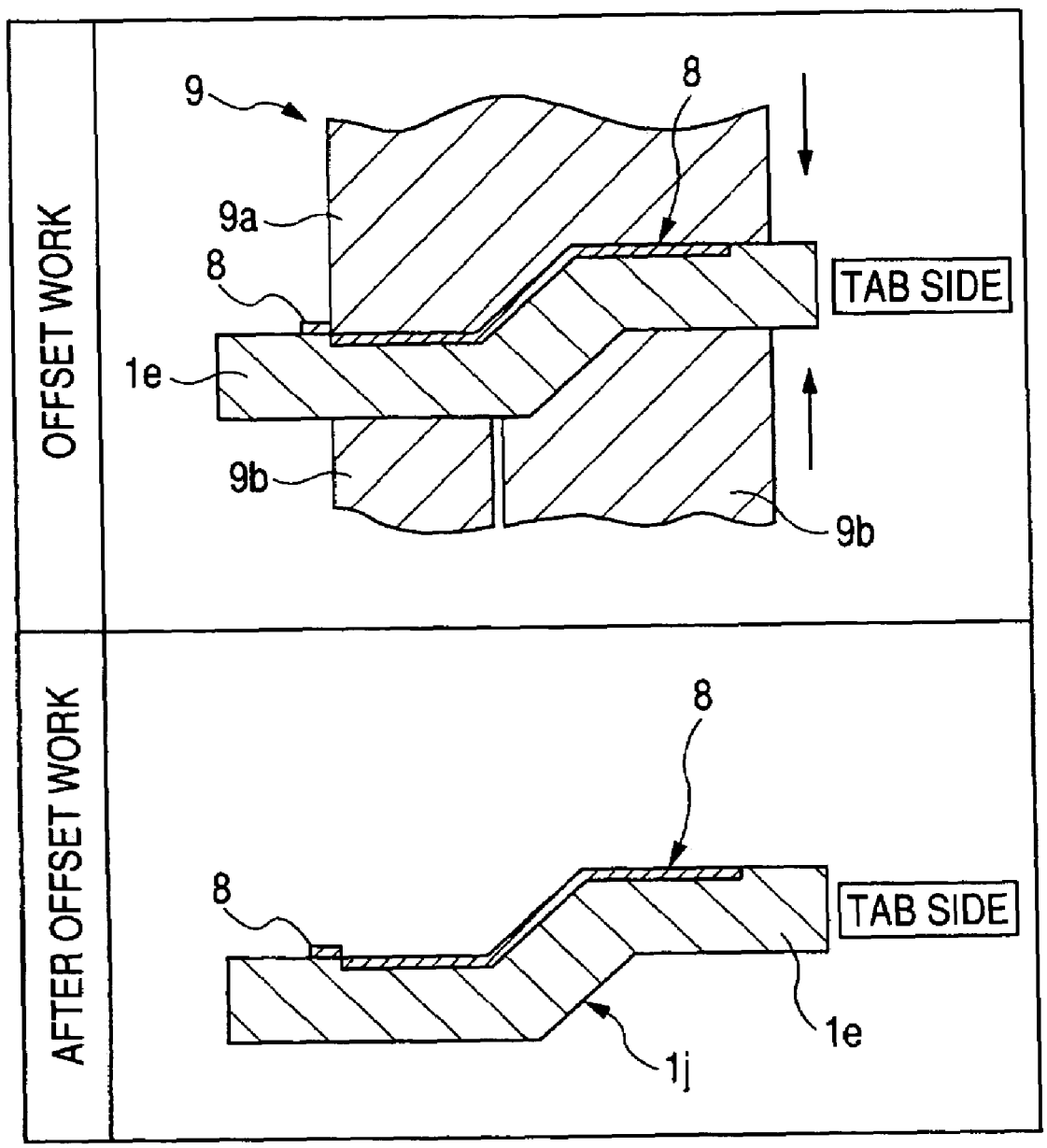
FIG. 17 is a partial sectional view showing an offset method for each suspending lead according to another modification of the first embodiment.

FIG. 12 comprises plan views and partial sectional views, showing an example of a die bonding procedure in assembling the semiconductor device of FIG. 1, FIG. 13 comprises a plan view and a partial sectional view, showing a structural example after the die bonding shown in FIG. 12, and FIG. 14 is a partial sectional view showing an example of a sliding state of a semiconductor chip in portion G shown in FIG. 13. Further, FIG. 15 is a plan view showing an internal structure of a semiconductor device according to a modification of the first embodiment as seen through a sealing body, FIG. 16 is a sectional view showing a cut structure along suspending leads in the semiconductor device of the modification shown in FIG. 15, FIG. 17 is a partial sectional view showing an offset method for each suspending lead according to another modification of the first embodiment, FIG. 18 comprises plan views and partial sectional views, showing an assembling procedure for a semiconductor device according to a further modification of the present invention, and FIG. 19 is a partial sectional view showing the structure of the semiconductor device of the modification fabricated in accordance with the assembling procedure shown in FIG. 18.

The semiconductor device of the first embodiment shown in FIGS. 1 to 5 is a small-sized package wherein plural leads 1a are arranged side by side so as to be each exposed partially in a peripheral edge portion of a back surface 3a of a sealing body 3. In this first embodiment, reference will be made below to a QFN 5 as an example of the semiconductor device.

A description will now be given about the construction of the QFN 5. As shown in FIG. 5, the QFN 5 comprises a semiconductor chip 2, the semiconductor chip 2 having on a main surface 2b thereof a semiconductor element and plural pads (electrodes) 2a, a tab 1b as a chip mounting portion connected to the semiconductor chip 2, plural leads 1a arranged side by side around the semiconductor chip 2, plural conductive wires 4, and a sealing body 3 formed of resin.

As shown in FIG. 8, each of the plural wires 4 provides an electric connection between a pad 2a in the semiconductor chip 2 and a lead 1a corresponding thereto. As shown in FIG. 5, the sealing body 3 is for sealing the semiconductor chip 2, tab 1b and plural wires 4.

The plural leads 1a are arranged side by side so that respective to-be-connected surfaces (a part) 1g are exposed to the peripheral edge portions of the back surface 3a of the sealing body 3, as shown in FIGS. 2 and 3. A groove 1k is formed in an upper surface 1h of each lead 1a, as shown in FIG. 7. Resin gets into the grooves 1k to form a part of the sealing body 3, whereby not only the bonding force between the leads 1a and the sealing body 3 can be enhanced, but also dislodgment of the leads 1a in the lead extending direction can be prevented.

The QFN 5 has suspending leads 1e arranged at positions corresponding to four corners of the sealing body 3 and connected to the tab 1b, as shown in FIG. 4.

As shown in FIG. 5, the tab 1b in the QFN 5 is formed so that the area of its main surface (chip mounting surface) 1c is smaller than that of the main surface 2b (back surface 2c) of the semiconductor chip 2. The QFN 5 is of a so-called small tab structure. In this small tab structure, a part of the sealing body 3 and a part of the back surface 2c of the semiconductor chip 2 are in close contact with each other.

As shown in FIG. 5, the QFN 5 is a so-celled tab-incorporated type QFN wherein the tab 1b is embedded in the interior of the sealing body 3 and a back surface 1d of the tab 1b is covered completely with resin. That is, a tab raising work for raising the position (height) of the tab 1b higher than the leads 1a is applied to the suspending leads 1e. More specifically, at the stage of fabricating the lead frame 1, the suspending leads 1e connected to the tab 1b are subjected to an offset work (bending) for raising the position of the tab 1b as shown in FIG. 4, thereby forming a bent portion 1j in each suspending lead 1e and making the tab 1b higher than each lead 1a.

On the other hand, if the tab 1b of QFN 5 is made level with the leads 1a without offset work, the back surface 1d of the tab 1b becomes exposed from the back surface 3a of the sealing body 3. On a semiconductor device-mounted side (surface) of a mounting substrate there are formed plural wiring patterns, so that concaves and convexes are formed on the surface of the mounting substrate. Therefore, if the tab 1b of QFN 5 is exposed from the back surface 3a of the sealing body 3, the back surface 1d of the tab 1b and the concaves and convexes on the mounting substrate interfere with each other at the time of mounting the QFN 5 onto the mounting substrate. As a result, there occurs connection imperfection between the leads 1a of QFN 5 and electrodes arranged on the mounting substrate. That is, if the back surface 1d of the tab 1b in QFN 5 is exposed from the back surface 3a of the sealing body 3, it is difficult to distribute plural wiring patterns to surface-side regions of the mounting substrate opposed to the tab 1b. In this first embodiment, however, since the position of the tab 1b is made higher than the leads 1b by offset work, the tab 1b is not exposed from the back surface 3a of the sealing body 3. As a result, even if concaves and convexes are formed on the surface of the mounting substrate, there is no fear of interference thereof with the back surface 3a of the sealing body 3 in QFN 5, thus permitting distribution of plural wiring patterns.

In the QFN 5, as shown in FIGS. 6 and 7, a silver plating (silver plating film or layer) 8 is formed on the upper surface 1h of each lead Sa and also on an upper surface (first main surface) 1i of each suspending lead 1e. The silver plating 8 is for wire connection and for enhancing the strength of connection with the wires 4 such as gold wires.

However, the silver plating 8 on the upper surface 1i of the suspending lead 1e shown in FIG. 6 and the silver plating 8 on the upper surface 1h of the lead 1a shown in FIG. 6 are different in thickness. More particularly, the silver plating 8 on the upper surface 1i of the suspending lead 1e shown in FIG. 6 is, for example, about 1 to 3 μm thick because it is crushed by an offset die 9 in offset work for the suspending lead 1e, while the silver plating 8 on the upper surface 1h of the lead 1a shown in FIG. 7 is, for example, about 5 to 8 μm thick because it is not crushed by the die or the like. Thus, the silver plating 8 on the upper surface 1i of the suspending lead 1e shown in FIG. 6 is obviously thinner than the silver plating 8 on the upper surface 1h of the lead 1a shown in FIG. 7.

The silver plating 8 on the suspending lead 1e is in an embedded state into the suspending lead 1e (the surface thereof) as shown in FIG. 6, while the silver plating 8 on the lead 1a is in a state of being formed on the surface of the lead 1a as shown in FIG. 7.

Figure 27:
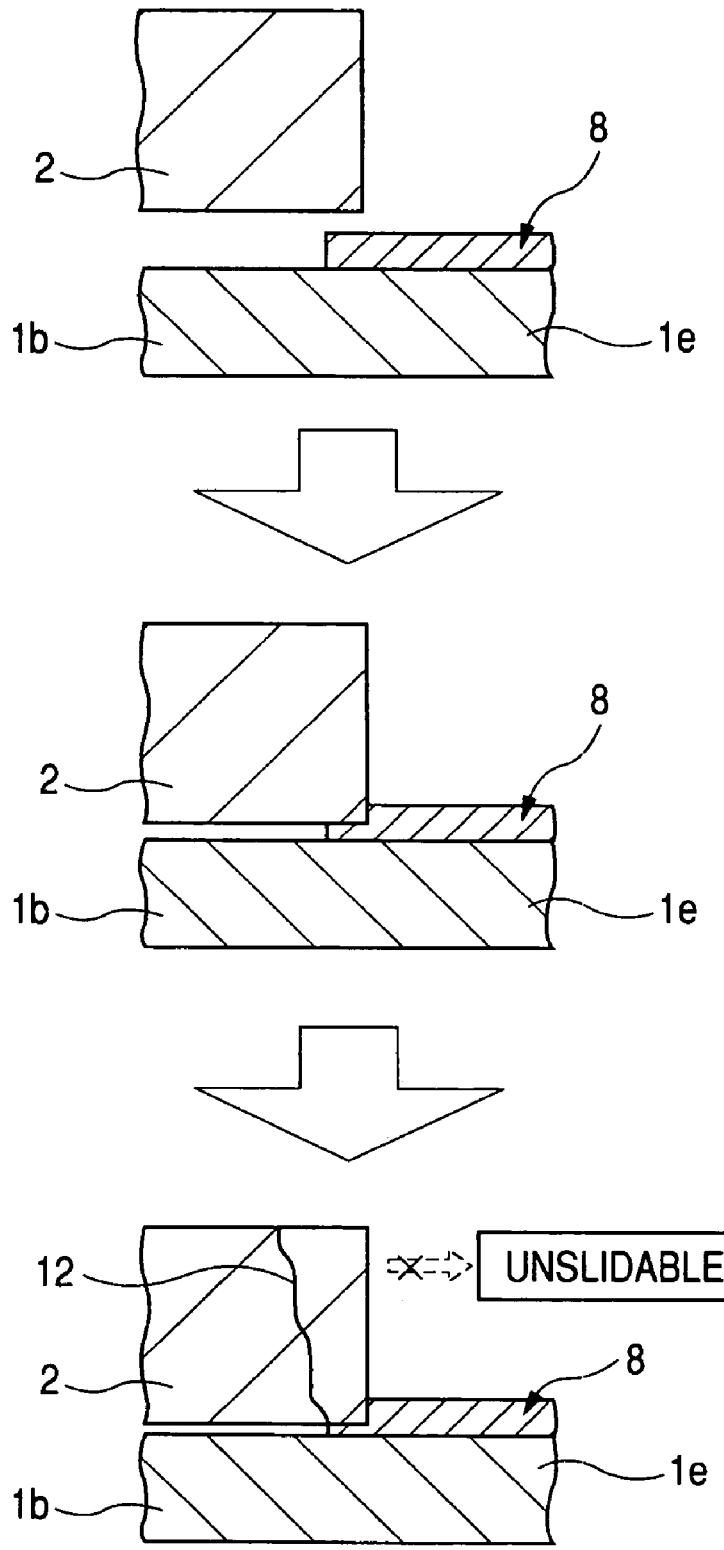
FIG. 27 is a partial sectional view showing an unslidable state of a semiconductor chip in portion H in the comparative example.

There sometimes is a case where a part of the thus-formed silver plating 8 remains in a projected state without being crushed by the offset die 9 in offset work. If the manufacturing process shifts to the die bonding process in such a state, the back surface (end portion) 2c of the semiconductor chip 2 comes into contact with the silver plating 8 which is formed in a projected state onto the suspending leads 1e and a crack 12 is developed in the semiconductor chip 2 as in FIG. 27, thus resulting in the semiconductor device becoming defective. This problem can be solved if at least the tab 1b-side end portion of the silver plating 8 on each suspending lead is in a crushed state by offset work at the time of mounting the semiconductor chip 2 onto the tab 1b of the lead frame 1. In other words, the silver plating 8 should not be projected onto each suspending lead 1e to avoid interference with the back surface (end portion) 2c of the semiconductor chip 2 at the time of mounting the semiconductor chip. This requirement can be met if all the silver plating films 8 formed on the suspending leads 1e are crushed by the offset die 9.

Since the QFN 5 of this first embodiment is of a small tab structure, semiconductor chips 2 of various sizes can be mounted onto the tab 1b. But a description will here be given about the case where a semiconductor chip 2 which is relatively large in comparison with the package size is mounted on the tab. For example, the size of the mounted semiconductor chip 2 is 3.5 mm×4.5 mm relative to the package size of 5 mm×6 mm.

Therefore, as shown in FIG. 8, outer end portions of the semiconductor chip 2 are close to tab-side end portions of the leads 1a. In such a mutually approximated structure of end portions of the leads 1a and end portions of the semiconductor chip 2, as shown in FIGS. 4 and 6, end portions (near the corners) of the semiconductor chip 2 and the tab-side end portions of the silver plating 8 formed on the upper surfaces 1i of the suspending leads 1e are in an overlapped layout in plan.

However, in the QFN 5 of this first embodiment, the semiconductor chip 2 mounted on the tab may be a relatively small semiconductor chip whose end portions (near the corners) do not planarly overlap with the tab-side end portions of the silver plating 8 formed on the upper surfaces 1i of the suspending leads 1e.

As shown in FIG. 6, the semiconductor chip 2 is fixed onto the main surface 1c of the tab 1b through a die bonding material (e.g., silver paste) 6, and the back surface 2c of the semiconductor chip 2 and the main surface 1c of the tab 1b are connected together through the die bonding material 6.

As shown in FIG. 3, the leads arranged side by side in the peripheral edge portion of the back surface 3a of the sealing body 3 in QFN 5 are each partially exposed as the to-be-connected surface 1g to the back surface 3a of the sealing body 3. The back surfaces 1f of the suspending leads 1e arranged respectively at the four corners of the sealing body 3 are exposed respectively to the four corners of the back surface 3a of the sealing body 3. The to-be-connected surfaces 1g of the leads 1a and the back surfaces 1f of the suspending leads 1e are plated by exterior plating, e.g., solder plating or lead-free plating.

The tab 1b, suspending leads 1e and leads 1a are formed for example by a thin plate such as a thin copper alloy plate.

The wires 4 for connection between the pads 2a of the semiconductor chip 2 and the corresponding leads 1a are gold wires for example.

The sealing body 3 is formed by a molding method using resin. The sealing resin is, for example, a thermosetting epoxy resin.

The following description is now provided about a method of manufacturing the QFN 5 (semiconductor device) according to this first embodiment.

Reference will be made first to a method of forming the silver plating 8 by the application of silver plating for wire connection in the lead frame 1 used in assembling the QFN 5, as well as the offset work for the suspending leads 1e.

First, mask layout is performed as shown in FIG. 9. More specifically, a mask 7 for plating is disposed for the lead frame 1 after etching to form lead patterns. In this case, the mask 7 and the lead frame 1 are subjected to positioning so that apertures 7a of the mask 7 are disposed on wire connections (tab 1b-side end portions of the leads 1a) of the upper surfaces 1h of the leads 1a which wire connections are to be subjected to wire bonding in a later step and so that a body center portion 7b of the mask 7 is disposed above the tab 1b, then the mask 7 and the lead frame 1 are fixed.

Thereafter, plating is performed by a plating apparatus to form a silver plating 8. At this time, the silver plating 8 is formed on only the apertures 7a of the mask 7. That is, the silver plating 8 is formed on the upper surface 1h of each lead 1a. However, the alignment accuracy of the mask 7 is deteriorated with reduction in size of the semiconductor device and narrowing of pitch. Consequently, even if the mask 7 is disposed (not shown) also on the suspending leads 1e so as not to form the silver plating 8 on the suspending leads, the silver plating 8 is formed on the suspending leads 1e. At this time, since the silver plating 8 on the suspending leads 1e and the silver plating 8 on the leads 1a are formed in the same plating process, the former is equal in thickness to the latter.

Subsequently, the mask 7 is removed from the lead frame 1 to complete formation of the silver plating 8.

Thereafter, an offset work for the suspending leads 1e is performed as shown in FIG. 10. That is, for increasing the height of the tab 1b there is performed an offset work which is a bending work for the suspending leads 1e.

First, the lead frame 1 formed with the silver plating 8 is disposed above a lower die 9b of an offset die 9 and thereafter the portion of each suspending lead 1e where the silver plating 8 is formed is sandwiched between an upper die 9a and the lower die 9b and is subjected to an offset work. As shown in the portion "Offset Work" of FIG. 10, the upper die 9a used in this offset work is of a size which can cover the whole of the silver plating on each suspending lead 1e completely, and the lower die 9b used in the same work mates with the upper die 9a. That is, the area of contact of the offset die 9 with each suspending lead 1e is larger than the silver plating 8 formed on the suspending lead.

Consequently, as shown in the portion "After Offset Work" of FIG. 10, the whole of the silver plating 8 is crushed into a flat surface free of any projecting portion. Moreover, since the silver plating 8 is embedded into the suspending lead 1e by the offset work, the surface of the silver plating 8 becomes lower than the upper surface 1i of the suspending lead 1e.

The amount of offset in the offset work is, for example, 0.14 to 0.18 mm.

Figure 11:
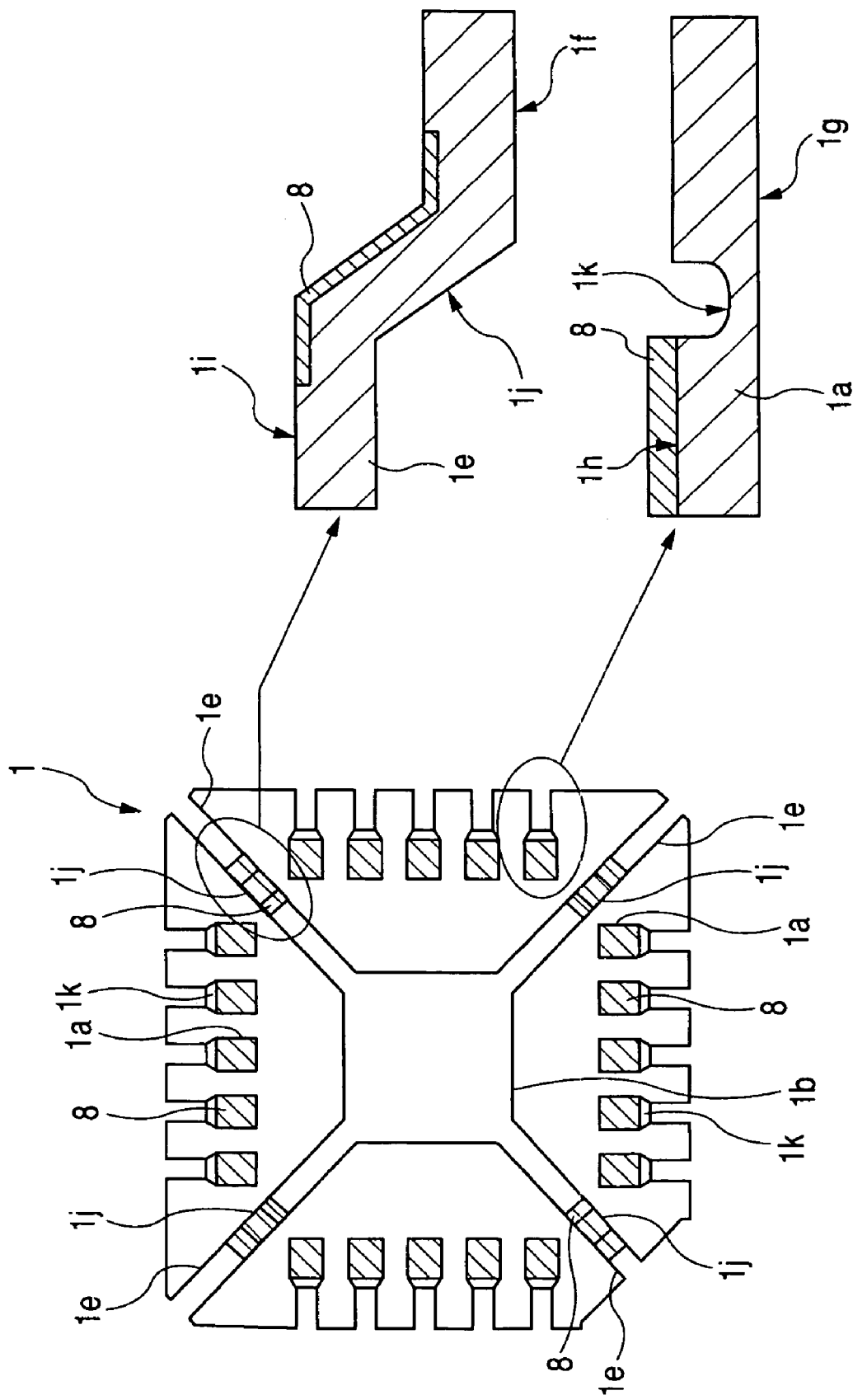
FIG. 11 comprises a plan view and partial sectional views, showing a structural example after offset work of the suspension leads of the lead frame shown in FIG. 10.

By the offset work there is formed a bent portion 1j of each suspending lead 1e as shown in FIG. 11 and the position of the tab 1b becomes higher than that of each lead 1a. Further, the thickness of the silver plating 8 on the suspending lead 1e becomes smaller than that of the silver plating 8 on each lead 1a. That is, the silver plating 8 on the suspending lead 1e crushed by the offset die 9 in the offset work is obviously thinner than the silver plating 8 on each uncrushed lead 1a. For example, the thickness of the silver plating 8 on each suspending lead 1e crushed by the offset die 9 is about 1 to 3 μm, while the thickness of the silver plating 8 on each uncrushed lead 1a is about 5 to 8 μm.

Thereafter, the QFN 5 is assembled using the lead frame which has thus been silver-plated and subjected to the offset work.

First, the lead frame 1 shown in FIG. 11 is provided. The lead frame 1 has a tab 1b, plural leads 1a arranged around the tab 1b and suspending leads 1e which support the tab 1b. In the lead frame 1, moreover, the thickness of a tab-side end portion of the silver plating (metal plating) 8 for wire connection formed on each suspending lead 1e is smaller than that of the silver plating 8 for wire connection formed on each lead 1a.

The whole of the silver plating 8 on each suspending lead 1e is formed flat and is free of any portion projecting from the upper surface 1i of the suspending lead 1e. Further, the suspending lead 1e has been subjected to the offset work and has the bent portion 1j at its portion where the silver plating 8 is formed. As a result, the position of the tab 1b is higher than that of each lead 1a.

The lead frame 1 is a frame for a small stab structure wherein the area of the main surface (chip mounting surface) 1c of the tab 1b is smaller than the area of the back surface 2c of the semiconductor chip 2 mounted on the tab.

Then, the die bonding shown in FIG. 12 is performed. First, paste is applied. More specifically, a die bonding material 6 such as silver paste is applied onto the tab 1b of the lead frame 1.

Thereafter, chip mounting is performed. As shown in FIG. 12, the semiconductor chip 2 adopted in this first embodiment is relatively large in size such that outer end portions of the semiconductor chip 2 are close to tab-side end portions of the leads 1a.

Subsequently, the semiconductor chip 2 is chucked by a collet 10 and is conveyed onto the tab 1b, then the collet 10 is brought down and the semiconductor chip 2 is forced down against the tab 1b through the die bonding material 6 by means of the collet 10, thereby connecting the semiconductor chip 2 to the tab 1b. In this case, since a chucking surface 10a of the collet 10 is tapered (inclined) and is formed with a play, the semiconductor chip 2 is in many cases not held horizontally with respect to the main surface 1c of the tab 1b. There sometimes is a case where the semiconductor chip 2 is disposed obliquely in the course of the die bonding material 6 on the main surface 1c of the tab 1b being crushed by the semiconductor chip 2.

However, in the semiconductor device manufacturing method according to this first embodiment, the whole of the silver plating 8 is crushed in the offset work for the suspending leads 1e into a flat surface free of any projecting portion (the upper surface 1i of each suspending lead 1e and the surface of the silver plating 8 are almost flush with each other) and the tab-side end portion and the vicinity thereof of the silver plating 8 on each suspending lead 1e is also a flat surface as indicated at portion G in FIG. 13.

Therefore, when mounting the chip as in FIG. 14, it is possible to prevent the back surface (end portion) 2c of the semiconductor chip 2 from coming into contact with the silver plating 8 projecting onto each suspending lead 1e before the chip 2 is mounted onto the tab 1b through the die bonding material 6. As a result, even if the semiconductor chip 2 slides up to the region of the silver plating 8 on the suspending lead 1e at the time of mounting the chip 2, the chip can slide on the tab 1b without contact between a side face thereof and the silver plating 8 and the damage to the semiconductor chip 2 in die bonding is diminished, whereby it is possible to prevent the occurrence of cracking or chipping of the semiconductor chip in the semiconductor device (QFN 5).

Since the cracking or chipping is prevented, it is possible to enhance reliability and quality of the semiconductor device (QFN5).

As shown in FIG. 13, the semiconductor chip 2 mounted on the QFN 5 is relatively large in size such that its outer end portions are close to the tab-side end portions of the leads 1a.

Thus, after mounting of the semiconductor chip 2, the tab 1b-side end portion of the silver plating 8 formed on each suspending lead 1e is disposed at a position planarly overlapping an end portion (corner) of the chip 2.

Thereafter, wire bonding is performed. More specifically, as shown in FIG. 5, pads 2a of the semiconductor chip 2 and corresponding leads 1a are connected together electrically through conductive wires 4 such as gold wires. In this case, as shown in FIG. 7, since the silver plating 8 for wire connection is formed on the upper surface 1h of each lead 1a, it is possible to enhance the strength of connection between the wires 4 and the leads 1a. Further, since the silver plating 8 formed on each lead 1a has not been subjected to press working, its thickness is an as formed thickness of the silver plating and is larger than the thickness of the silver plating 8 formed on each suspending lead 1e. As a result, the thickness portion of the silver plating 8 on each lead 1a serves as a cushion to receive the corresponding wire 4 and therefore it is possible to improve the strength of connection between the leads 1a and the wires 4.

Subsequently, resin sealing (resin molding) is performed. More specifically, the semiconductor chip 2, tab 1b and plural wires 4 are sealed with resin to form a sealing body 3. The resin is, for example, a thermosetting epoxy resin. As shown in FIG. 5, the sealing body 5 is formed in such a manner that the tab 1b is covered completely with the resin and that the to-be-connected surfaces (a part) 1g of the plural leads 1a are exposed to the back surface 3a of the sealing body 3.

The resin sealing process is followed by dividing into individual pieces to complete the assembly of QFN 5 shown in FIGS. 1 to 5.

Next, modifications of this first embodiment will be described below.

In a QFN 5 shown in FIGS. 15 and 16, a wire 4 is connected to the silver plating 8 formed on the upper surface 1i of a suspending lead 1e. For example, for using common terminals for the ground and the power supply and for strengthening the terminals, the silver plating for wire connection formed on the upper surface 1i of each suspending lead 1e is used positively.

That is, a ground or power supply pad 2a of the semiconductor chip 2 and the silver plating 8 on a suspending lead are connected together through a wire 4.

Thus, the silver plating film 8 formed on a suspending lead 1e in QFN 5 may be used for wire connection.

According to a modification shown in FIG. 17, an offset work for the suspending leads 1e, the offset work is performed in such a manner that an end portion of the silver plating 8 for wire connection on the side (outer side) opposite to the tab side remains uncrushed. By so doing, in the lead frame 1, as shown in FIG. 11, the thickness of the tab-side end portion of the silver plating 8 on each suspending lead becomes smaller than that of the silver plating 8 formed on each lead 1a and also smaller than the thickness of the opposite-side end portion of the silver plating.

The offset work for the suspending leads 1e in the lead frame 1 used in the semiconductor device manufacturing method of the first embodiment is not always required to crush the whole of the silver plating 8. More particularly, the end portion opposite to the tab-side end portion of the silver plating 8 on each suspending lead 1e need not always be crushed in the offset work.

By thus making the end portion on the side (outer side) opposite to the tab side of the silver plating 8 on each suspending lead 1e equal in thickness to the silver plating 8 on each lead 1a without crushing it, the connection reliability in wire bonding can be improved over the case where the upper surfaces 1i of the suspending leads 1e and the main surface 1c of the tab 1b are formed level with each other, at the time of performing such a down-bonding work as shown in FIGS. 15 and 16. This is because the silver plating 8 is thick and fulfills a cushioning function and therefore the adhesion to the wire 4 is improved.

Figure 18:
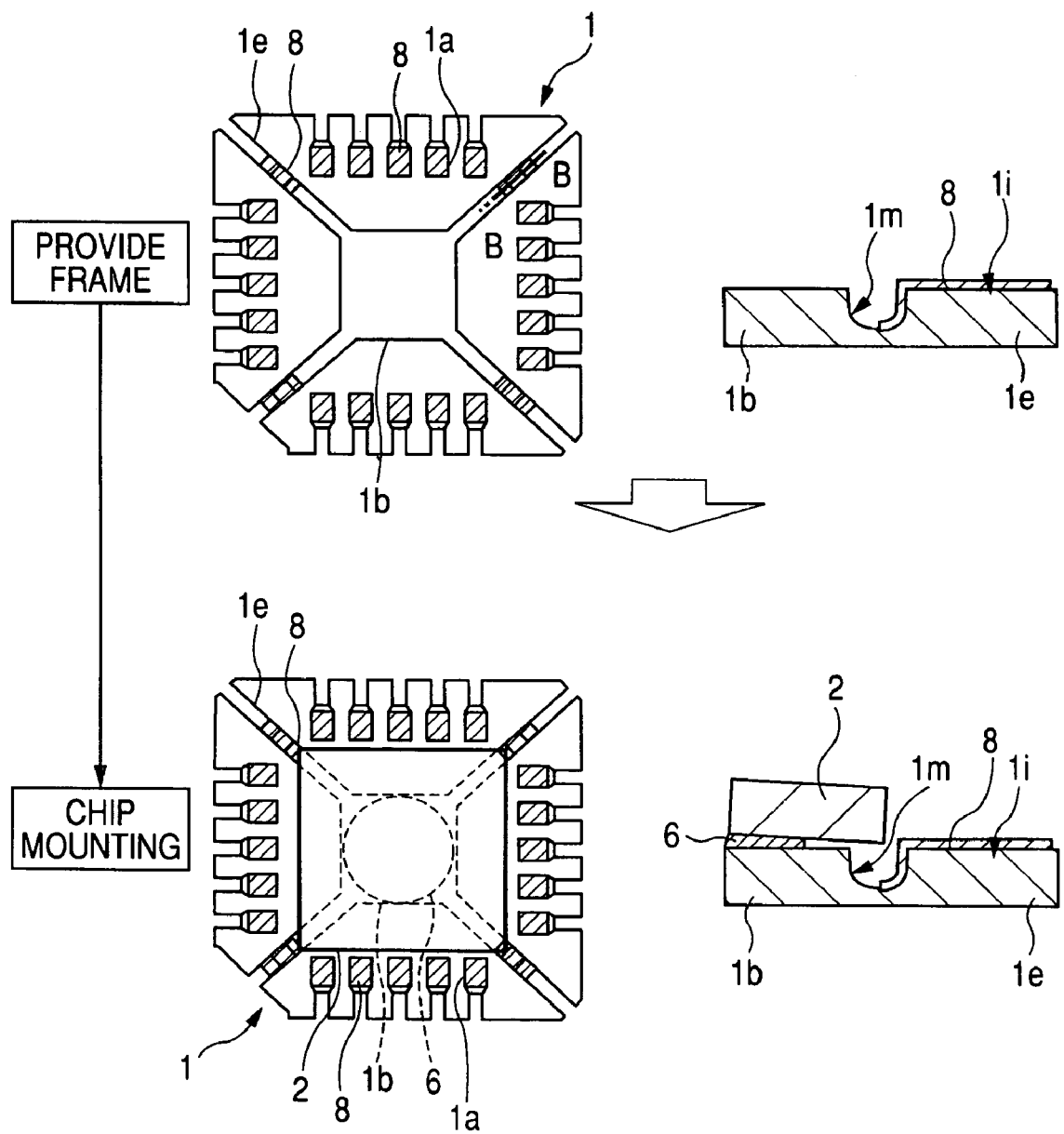
FIG. 18 comprises plan views and partial sectional views, showing an assembling procedure for a semiconductor device according to a further modification of the first embodiment.
Figure 19:
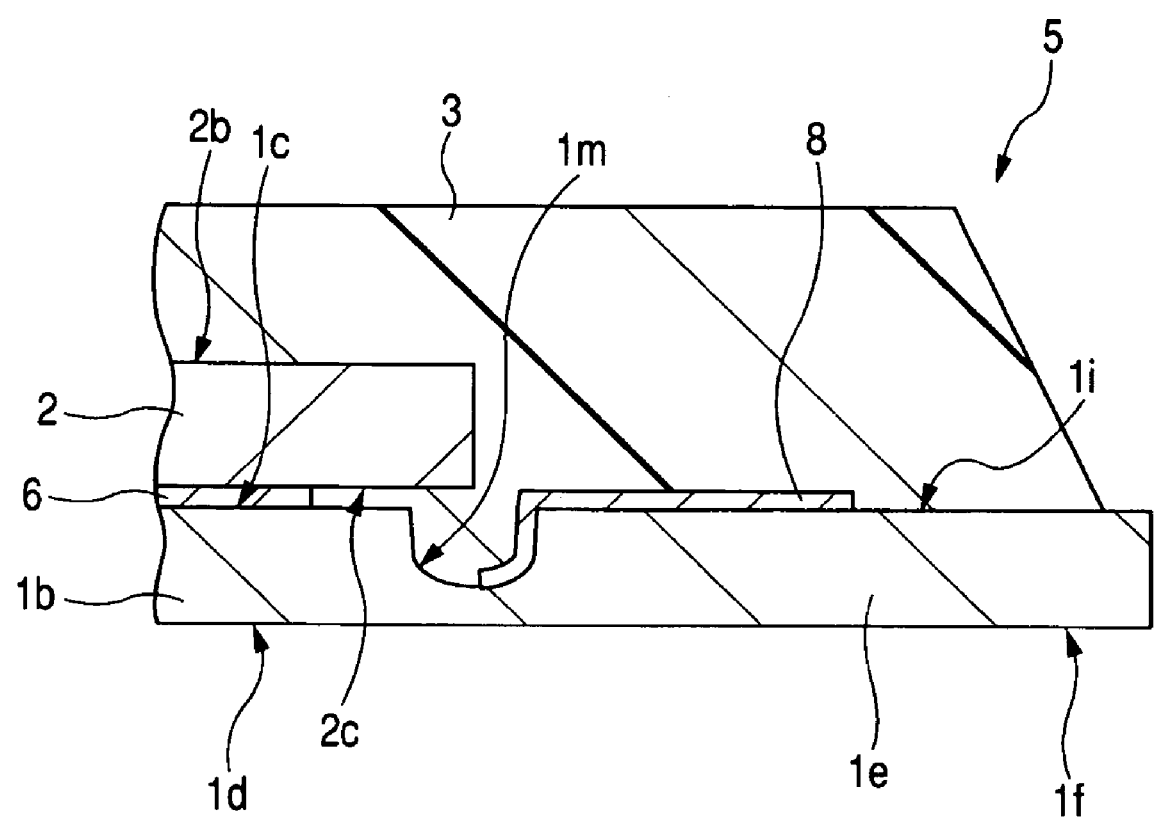
FIG. 19 is a partial sectional view showing the structure of the semiconductor device of the modification fabricated in accordance with the assembling procedure shown in FIG. 18.

A modification shown in FIGS. 18 and 19 is concerned with a QFN 5 of an exposed tab structure wherein the back surface 1d of the tab 1b is exposed to the back surface 3a of the sealing body 3.

In a lead frame 1 used in assembling the QFN 5 of the exposed tab structure, the offset work is not performed for the suspending leads 1e, but a recess 1m is formed in the upper surface (first main surface) 1i of each suspending lead 1e which upper surface is connected to the main surface 1c of the tab 1b. The recess 1m is formed for example by a half etching work.

Thus, when assembling the QFN 5, there is provided the lead frame 1 shown in FIG. 1 wherein the upper surfaces 1i of the suspending leads 1e and the main surface 1c of the tab 1b are formed level with each other and the tab-side end portion of the silver plating 8 for wire connection formed on each suspending lead 1e are disposed within the recess 1m formed in the upper surface 1i.

When mounting the semiconductor chip 2 onto the tab in the subsequent die bonding process, as shown in FIG. 18, there is no fear of interference between the tab-side end portion of the silver plating 8 on each suspending lead 1e and the semiconductor chip 2 because the former is disposed within the recess 1m.

Therefore, also in the die bonding process for the QFN 5 of the exposed tab structure, the semiconductor chip 2 can slide on the tab 1b without contact with the silver plating 8 at the time of mounting the chip and hence it is possible to diminish the damage to the semiconductor chip when mounting the chip. As a result, it is possible to prevent the occurrence of cracking or chipping of the semiconductor chip in the QFN 5 of the exposed tab structure.

The die bonding process is followed by wire bonding and subsequent sealing with resin. In the resin sealing process, the semiconductor chip 2, the main surface side of the tab 1b and the plural wires 4 are sealed with resin to form a sealing body 3. The sealing body 3 is formed in such a manner that the to-be-connected surfaces (a part) 1g of plural leads 1a are exposed to the back surface 3a of the sealing body 3 and that the back surface (a part) 1d of the tab 1b is exposed to the sealing body back surface 3a, as shown in FIG. 19.

The resin-sealing process is followed by dividing into individual pieces to complete assembly of the QFN 5 of the exposed tab structure.

As a result, the occurrence of cracking or chipping of the semiconductor chip can be suppressed and hence it is possible to improve the reliability and quality of the semiconductor device (QFN 5). Further, since the back surface 1d of the tab 1b is exposed from the back surface 3a of the sealing body 3, the heat dissipating performance of the semiconductor device (QFN 5) can be improved over the case shown in FIGS. 4 and 5.

Second Embodiment

Figure 20:
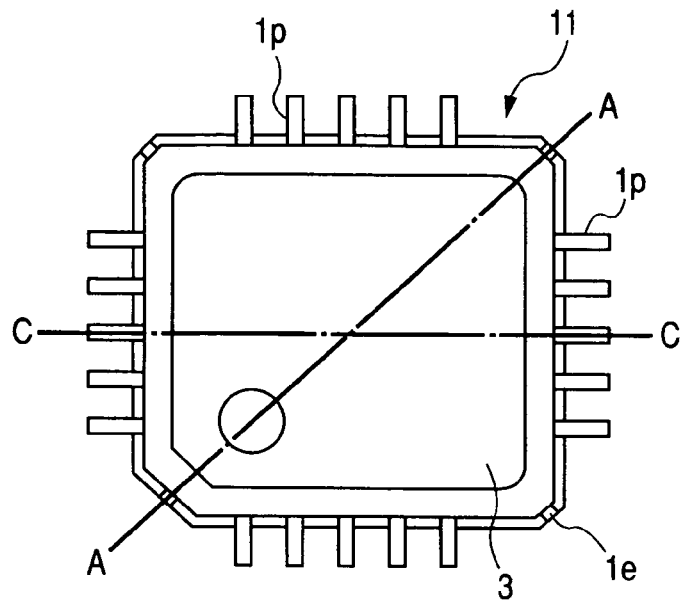
FIG. 20 is a plan view showing an example of the structure of a semiconductor device according to a second embodiment of the present invention.
Figure 21:
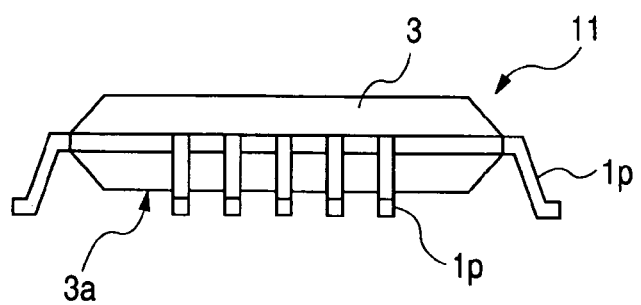
FIG. 21 is a side view thereof.
Figure 22:
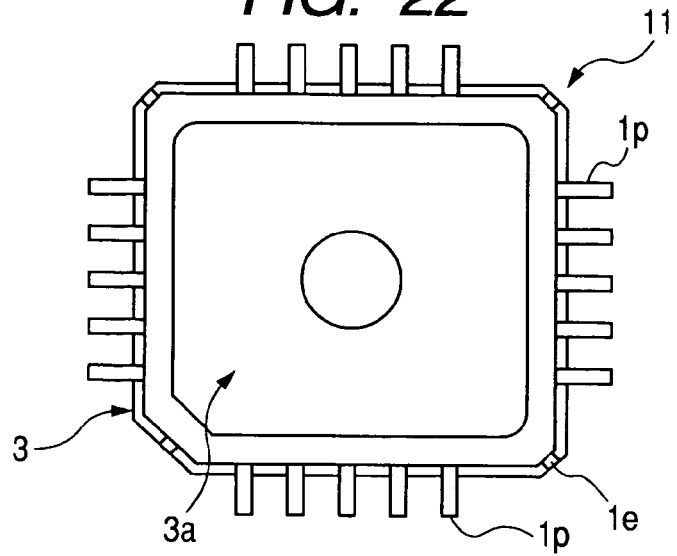
FIG. 22 is a back view thereof.
Figure 23:
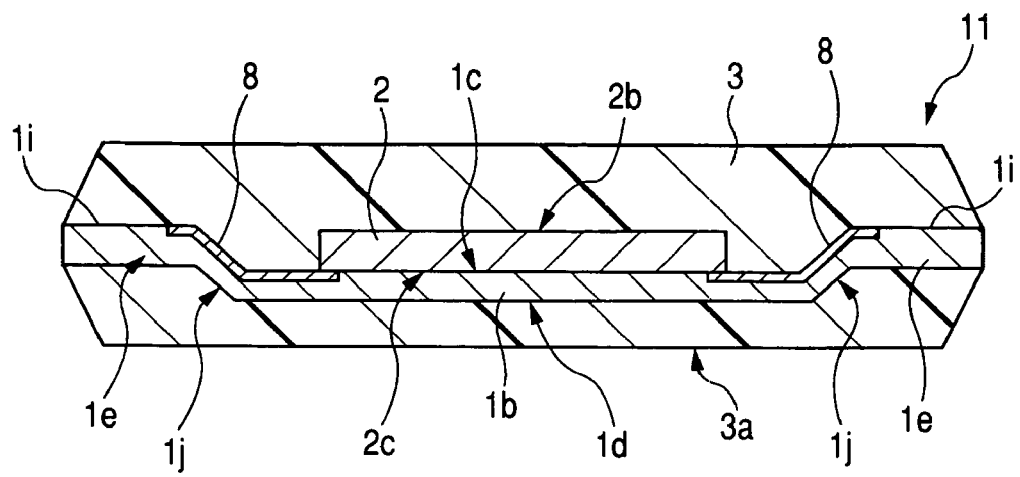
FIG. 23 is a sectional view showing the structure of a section cut along line A-A in FIG. 20.
Figure 24:
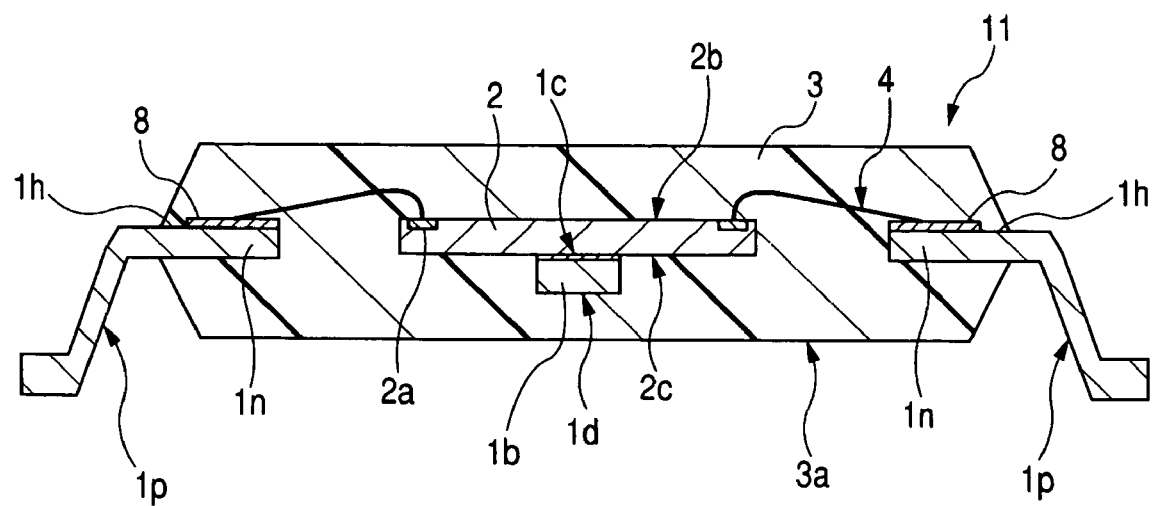
FIG. 24 is a sectional view showing the structure of a section cut along line C-C in FIG. 20.
Figure 25:
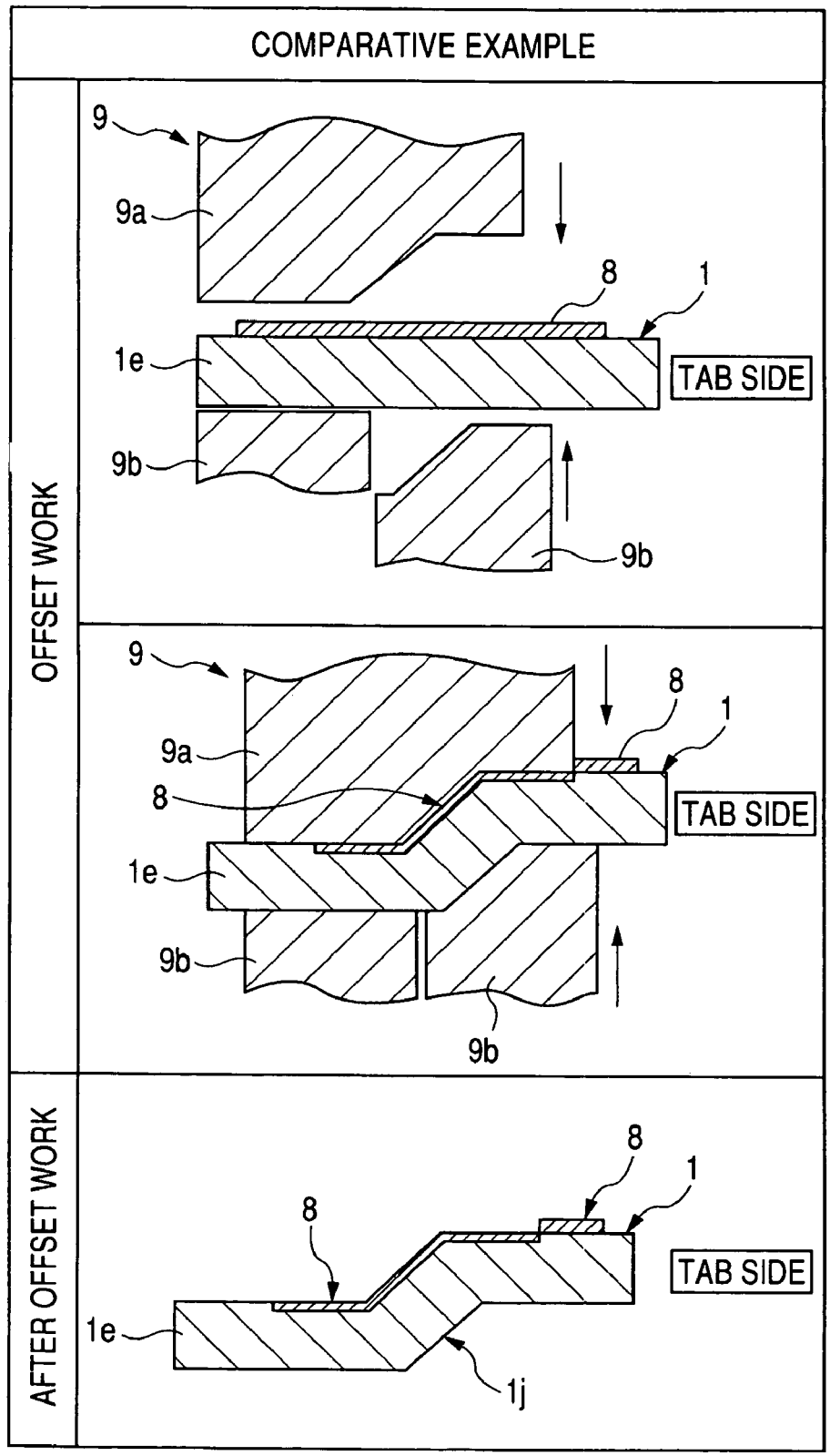
FIG. 25 is a partial sectional view showing an offset work method for each suspending lead of a lead frame in a comparative example.
Figure 26:
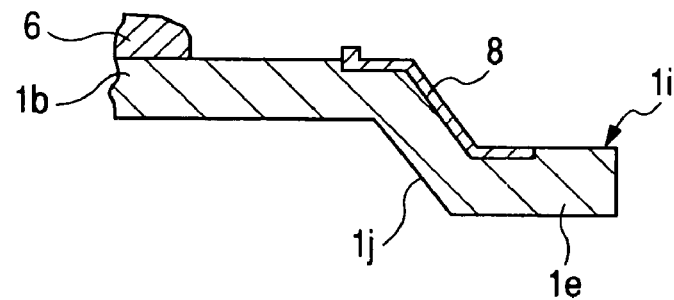
FIG. 26 is a partial sectional view showing a die bonding procedure in the comparative example.
Figure 26:
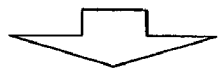
Figure 26:
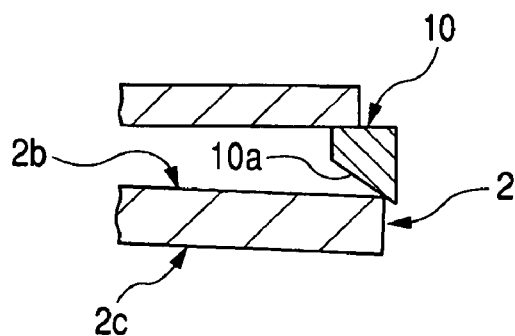
Figure 26:
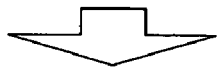
Figure 26:
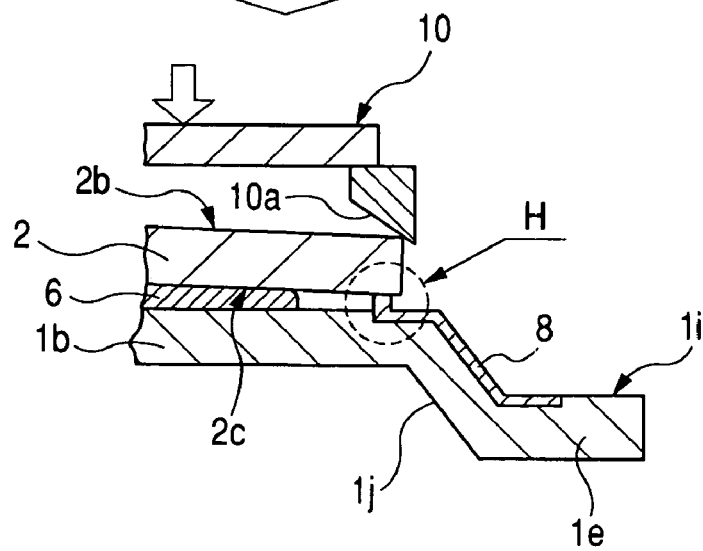

FIG. 20 is a pan view-showing a structural example of a semiconductor device according to a second embodiment of the present invention, FIG. 21 is a side view thereof, FIG. 22 is a back view thereof, FIG. 23 is a sectional view showing the structure of a section taken along line A-A in FIG. 20, and FIG. 24 is a sectional view showing the structure of a section taken along line C-C in FIG. 20.

The semiconductor device of this second embodiment shown in FIGS. 20 to 24 is a resin-sealed type QFP (Quad Flat Package) 11 wherein plural outer leads 1p serving as external terminals are projected from four side faces of a sealing body 3 formed of resin.

The QFP 11 comprises a tab 1b connected to a semiconductor chip 2, suspending leads 1e which support the tab 1b, plural inner leads in arranged around the semiconductor chip 2, wires 4 for electric connection between pads 2a of the semiconductor chip 2 and the inner leads in, outer leads 1p connected integrally with the inner leads in, and the sealing body 3 for sealing the semiconductor chip 2.

In the QFP 11, the position (height) of the tab 1b is lower than the inner leads 1n. That is, the suspending leads 1e which support the tab 1b have been subjected to an offset work (a tab lowering work) in the direction of a back surface 3a of the sealing body 3, whereby the height of the tab 1b is made lower than that of the inner leads 1n. Therefore, each suspending lead 1e has a bent portion 1j.

Silver plating 8 as metal plating for wire connection is formed on an upper surface 1h of each inner lead in and also on an upper surface 1i of each suspending lead 1e.

Like the QFN 5 of the first embodiment, the QFP 11 is of a small tab structure wherein the size of the tab 1b is smaller than that of the semiconductor chip 2, as shown in FIG. 24. Consequently, semiconductor chips 2 of various sizes can be mounted onto the tab 1b.

According to this structure, when a semiconductor chip 2 of a relatively large size is mounted onto the tab, as shown in FIG. 23, end portions (corners) of the semiconductor chip 2 and tab-side end portions of the silver plating 8 on the suspending leads 1e are overlapped each other in plan.

Also in assembling the QFP 11 of such a structure, by crushing the silver plating 8 by the same method as in the first embodiment at the time of offsetting the suspending leads 1e, it becomes possible for the semiconductor chip 2 to slide on the tab 1b without contacting the silver plating at the time of mounting the chip onto the tab in the die bonding process, thereby making it possible to diminish the damage to the semiconductor chip 2 when the chip is mounted onto the tab.

As a result, it is possible to prevent the occurrence of cracking or chipping in the QFP 11 which has thus been subjected to the tab lowering work. The QFP may be substituted for example by an SOP (Small Outline Package) having been subjected to the tab lowering work.

Although the present invention has been described above concretely on the basis of embodiments thereof, it goes without saying that the invention is not limited to the above embodiments, but that various changes may be made within the scope not departing from the gist of the invention.

For example, although in the above first and second embodiments the metal plating for wire connection applied to the leads 1a, inner leads in and suspending leads 1e are the silver plating 8, the metal plating may be a Pd (palladium) plating film formed partially or wholly on the lead frame. However, since Pd plating is comparatively higher in cost than Ag plating, it is preferable to adopt a partial Pd plating applied to only a required portion, whereby it is possible to prevent an increase of cost.

The present invention is suitable for a technique of manufacturing a semiconductor device having suspending leads.

What is claimed is:

1. A method of manufacturing a semiconductor device, comprising the steps of:
(a) providing a lead frame having a chip mounting portion, a plurality of leads disposed around the chip mounting portion, and suspending leads for supporting the chip mounting portion, each of the suspending leads having a bent portion, metal plating films being formed over a part of each of the plurality of leads and a part of each of the suspending leads including the bent portion, each of the metal plating films formed over the suspending leads having one end portion and another end portion opposing to the one end portion, the one end portion being positioned closer to the chip mounting portion than the another end portion;
(b) after the step (a), mounting a semiconductor chip over the chip mounting portion, the semiconductor chip having a main surface and a plurality of pads formed on the main surface; and
(c) after the step (b), electrically connecting the plurality of pads of the semiconductor chip with the plurality of leads through a plurality of wires and the metal plating films formed over the part of the plurality of leads, respectively;

wherein the bent portion is formed by the following steps:

(d1) providing an offset die having an upper die and a lower die opposing to the upper die, the upper die having an uneven surface;

(d2) disposing each of the suspending leads between the upper die and the lower die such that the one end portion of each of the metal plating films formed over the suspending leads is disposed between the upper die and the lower die;

(d3) clamping each of the suspending leads with the upper die and the lower die so as to form the bent portion and leveling the one end portion of each of the metal plating films formed over the suspending leads such that the one end portion of each of the metal plating films formed over the suspending leads is not protruded from a surface of each of the suspending leads.

2. A method of manufacturing a semiconductor device according to claim 1, wherein the material of the metal plating film is silver.

3. A method of manufacturing a semiconductor device according to claim 1, wherein the semiconductor chip is forced down against the chip mounting portion through a die bonding material by means of a collet having a tapered chucking surface and is thereby connected to the chip mounting portion.

4. A method of manufacturing a semiconductor device according to claim 1, further comprising, after the step (b), a step of sealing the semiconductor chip with resin to form a resinous sealing body, the sealing body being formed in such a manner that the chip mounting portion is covered with the resin.

5. A method of manufacturing a semiconductor device according to claim 1, further comprising, after the step (b), a step of sealing the semiconductor chip with resin to form a resinous sealing body, the resinous sealing body being formed in such a manner that the plural leads are partially exposed to a back surface of the resinous sealing body.

6. A method of manufacturing a semiconductor device according to claim 1, wherein a dimension of the uneven surface is larger than that of each of the metal plating films formed over the suspending leads.

7. A method of manufacturing a semiconductor device, comprising the steps of:

(a) providing a lead frame having a chip mounting portion, a plurality of leads disposed around the chip mounting portion, and suspending leads for supporting the chip mounting portion, each of the suspending leads having a bent portion, metal plating films being formed over a part of each of the plurality of leads and a part of each of the suspending leads including the bent portion, each of the metal plating films formed over the suspending leads having one end portion and another end portion opposing to the one end portion, the one end portion being positioned closer to the chip mounting portion than the another end portion;

(b) after the step (a), mounting a semiconductor chip over the chip mounting portion, the semiconductor chip having a main surface and a plurality of pads formed on the main surface, a dimension of the semiconductor chip being larger than that of the chip mounting portion; and (c) after the step (b), electrically connecting the plurality of pads of the semiconductor chip with the plurality of leads through a plurality of wires and the metal plating films formed over the part of the plurality of leads, respectively;

wherein the bent portion is formed by the following steps:

(d1) providing an offset die having an upper die and a lower die opposing to the upper die, the upper die having an uneven surface;

(d2) disposing each of the suspending leads between the upper die and the lower die such that the one end portion of each of the metal plating films formed over the suspending leads is disposed between the upper die and the lower die;

(d3) clamping each of the suspending leads with the upper die and the lower die so as to form the bent portion and leveling the one end portion of each of the metal plating films formed over the suspending leads such that the one end portion of each of the metal plating films formed over the suspending leads is not protruded from a surface of each of the suspending leads.

8. A method of manufacturing a semiconductor device according to claim 7, wherein a dimension of the uneven surface is larger than that of each of the metal plating films formed over the suspending leads.

9. A method of manufacturing a semiconductor device, comprising the steps of:

(a) providing a lead frame having a chip mounting portion, a plurality of leads disposed around the chip mounting portion, and suspending leads for supporting the chip mounting portion, each of the suspending leads having a bent portion, metal plating films being formed over a part of each of the plurality of leads and a part of each of the suspending leads including the bent portion, each of the metal plating films formed over the suspending leads having one end portion and another end portion opposing to the one end portion, the one end portion being positioned closer to the chip mounting portion than the another end portion;

(b) after the step (a), mounting a semiconductor chip over the chip mounting portions such that the one end of each of the metal plating films formed over the suspending leads is overlapped with the semiconductor chip, the semiconductor chip having a main surface and a plurality of pads formed on the main surface, a dimension of the semiconductor chip being larger than that of the chip mounting portion;

(c) after the step (b), electrically connecting the plurality of pads of the semiconductor chip with the plurality of leads through a plurality of wires and the metal plating films formed over the part of the plurality of leads, respectively;

wherein the bent portion is formed by the following steps:

(d1) providing an offset die having an upper die and a lower die opposing to the upper die, the upper die having an uneven surface;

(d2) disposing each of the suspending leads between the upper die and the lower die such that the one end portion of each of the metal plating films formed over the suspending leads is disposed between the upper die and the lower die;

(d3) clamping each of the suspending leads with the upper die and the lower die so as to form the bent portion and leveling the one end portion of each of the metal plating films formed over the suspending leads such that the one end portion of each of the metal plating films formed over the suspending leads is not protruded from a surface of each of the suspending leads.

10. A method of manufacturing a semiconductor device according to claim 9, wherein a dimension of the uneven surface is larger than that of each of the metal plating films formed over the suspending leads.

* * * * *